United States Patent
Gouko et al.

(10) Patent No.: US 10,622,535 B2
(45) Date of Patent: Apr. 14, 2020

(54) THERMOELECTRIC CONVERSION DEVICE AND METHOD OF MANUFACTURING THE SAME

(71) Applicant: DENSO CORPORATION, Kariya, Aichi-pref. (JP)

(72) Inventors: Norio Gouko, Kariya (JP); Toshihisa Taniguchi, Kariya (JP); Atusi Sakaida, Kariya (JP); Keiji Okamoto, Kariya (JP); Yoshihiko Shiraishi, Kariya (JP); Masahiro Asano, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 16/304,707

(22) PCT Filed: May 25, 2017

(86) PCT No.: PCT/JP2017/019454
§ 371 (c)(1),
(2) Date: Nov. 27, 2018

(87) PCT Pub. No.: WO2017/204275
PCT Pub. Date: Nov. 30, 2017

(65) Prior Publication Data
US 2019/0252594 A1 Aug. 15, 2019

(30) Foreign Application Priority Data
May 27, 2016 (JP) .................. 2016-106103

(51) Int. Cl.
*H01L 35/28* (2006.01)
*H01L 35/32* (2006.01)
*H01L 35/34* (2006.01)

(52) U.S. Cl.
CPC .............. *H01L 35/32* (2013.01); *H01L 35/34* (2013.01)

(58) Field of Classification Search
CPC ....................................... H01L 35/34
See application file for complete search history.

(56) References Cited

U.S. PATENT DOCUMENTS

| 5,824,561 A * | 10/1998 | Kishi ................ H01L 35/32 438/55 |
| 2005/0139249 A1 * | 6/2005 | Ueki ................ H01L 35/32 136/211 |
| 2016/0268493 A1 | 9/2016 | Gouko et al. |

FOREIGN PATENT DOCUMENTS

| JP | H07-162039 | * | 6/1995 |
| JP | H07162039 A | | 6/1995 |

(Continued)

OTHER PUBLICATIONS

English machine translation of JP H07-162039 (Year: 2019).*
English machine translation of JP 2014-042413 A (Year: 2019).*
English machine translation of JP 2007-095897 A (Year: 2019).*

*Primary Examiner* — Angelo Trivisonno
(74) *Attorney, Agent, or Firm* — Harness, Dickey & Pierce, P.L.C.

(57) ABSTRACT

With a method of manufacturing a thermoelectric conversion device, first via holes of a first insulator are filled with a first conductive paste. Third via holes of a second insulator are filled with a second conductive paste. Next, parts of the first conductive paste protruding from the first via holes of the first insulator are inserted into fourth via holes of the second insulator. Parts of the second conductive paste protruding from the third via holes of the second insulator are inserted into second via holes. Next, a rear surface protection member having rear surface wiring patterns, the second insulator, the first insulator, and a front surface protection (Continued)

member having front surface wiring patterns are arranged in this order to form a stacked body. Next, the stacked body is heated while being pressed in the stacking direction.

6 Claims, 10 Drawing Sheets

(56) References Cited

FOREIGN PATENT DOCUMENTS

| JP | H08097472 A |   | 4/1996 |
|----|-------------|---|--------|
| JP | 2007095897 A | * | 4/2007 |
| JP | 2014007408 A |   | 1/2014 |
| JP | 2014007409 A |   | 1/2014 |
| JP | 2014042413 A | * | 3/2014 |
| JP | 2015084365 A |   | 4/2015 |

* cited by examiner

THERMOELECTRIC CONVERSION DEVICE AND METHOD OF MANUFACTURING THE SAME

CROSS REFERENCE TO RELATED APPLICATIONS

This application is a U.S. National Phase Application under 35 U.S.C. 371 of International Application No. PCT/JP2017/019454 filed on May 25, 2017. This application is based on and claims the benefit of priority from Japanese Patent Application No. 2016-106103 filed on May 27, 2016. The entire disclosures of all of the above applications are incorporated herein by reference.

FIELD

The present disclosure relates to a thermoelectric conversion device and a method of manufacturing the same.

BACKGROUND

A conventionally-known thermoelectric conversion device has a thin plate-like shape, and outputs a signal in accordance with the heat flux that flows between one surface and the other surface in the thickness direction. A method of manufacturing such a thermoelectric conversion device is described in PTL 1.

The method of manufacturing a thermoelectric conversion device described in PTL 1 is as follows. With this manufacturing method, first, a plurality of via holes and a plurality of voids are provided in an insulating base material including a thermoplastic resin. Then, the plurality of via holes are filled with conductive pastes containing alloy powder and an organic solvent. Next, a front surface protection member having front surface wiring patterns in contact with ends of the plurality of conductive pastes is arranged on one surface of the insulating base material. Then, a rear surface protection member having rear surface wiring patterns in contact with the other ends of the plurality of conductive pastes is arranged on the other surface of the insulating base material so that a stacked body is formed. Next, an integrating step of heating the stacked body while pressing it in the stacking direction is performed using a vacuum pressing machine. In this manner, with the method of manufacturing a thermoelectric conversion device described in PTL 1, the conductive pastes are solid-phase sintered through the integrating step, and a plurality of conductors are formed. Then, with this manufacturing method, the conductors, the front surface wiring patterns, and the rear surface wiring patterns are electrically connected to each other, and the insulating base material, the front surface protection member, and the rear surface protection member are bonded together under pressure.

With this manufacturing method, the thermoplastic resin that constitutes the insulating base material flows into the voids when the above-mentioned integrating step is performed, which reduces the thickness of the insulating base material. Consequently, loads are efficiently applied from the pressing machine to the conductive pastes. Therefore, with this manufacturing method, the conductive pastes can be solid-phase sintered to form conductors, and the conductors, the front surface wiring patterns, and the rear surface wiring patterns can be electrically connected to each other.

PATENT LITERATURE

PTL 1: JP 2014-007408 A

The insulating base material used for the manufacturing method described in PTL 1 includes a thermoplastic resin that can flow into the voids by being heated in the integrating step. In other words, a thermoplastic resin with a melting point lower than the temperature for heating in the integrating step is used as a resin for the insulating base material. Therefore, the thermoelectric conversion device manufactured with this manufacturing method is difficult to use at temperatures higher than the melting point of the thermoplastic resin. Thus, there is a need for a method of manufacturing a thermoelectric conversion device including an insulating base material formed of a thermoplastic resin with such a high melting point that the thermoelectric conversion device can be used at high temperatures. Alternatively, there is a need for a method of manufacturing a thermoelectric conversion device including an insulating base material formed of a thermosetting resin.

However, if the insulating base material is formed of a thermoplastic resin with a high melting point that hardly flows or of a thermosetting resin, the thickness of the insulating base material is not reduced in the integrating step. Therefore, it is difficult to efficiently apply loads from the pressing machine to the conductive pastes with the conventional manufacturing method. Thus, the development of a new method of manufacturing a thermoelectric conversion device is required.

An object of the present disclosure is to provide a method of manufacturing a thermoelectric conversion device with high heat resistance. Another object of the present disclosure is to provide a thermoelectric conversion device with high heat resistance.

SUMMARY

A method of manufacturing a thermoelectric conversion device as an aspect of the technique of the present disclosure includes first, second, and third forming steps, first and second filling steps, an arranging step, first and second preparing steps, and a pressure bonding step.

The first forming step (S10) includes preparing a first insulator (11) having a plate-like shape and forming first and second via holes (101, 102) in the first insulator.

The second forming step (S20) includes preparing a second insulator (12) having a plate-like shape and forming third and fourth via holes (103, 104) in the second insulator.

The first filling step (S30) includes filling the first via holes with a first conductive paste (131) containing alloy powder and a solvent such that the first conductive paste protrudes from the first via holes by an amount larger than the thickness of the second insulator.

The second filling step (S40) includes filling the third via holes with a second conductive paste (141) containing alloy powder and a solvent different from those of the first conductive paste such that the second conductive paste protrudes from the third via holes by an amount larger than the thickness of the first insulator.

The arranging step (S50) includes arranging the first insulator and the second insulator such that parts of the first conductive paste protruding from the first via holes of the first insulator face the fourth via holes of the second insulator and parts of the second conductive paste protruding from the third via holes of the second insulator face the second via holes of the first insulator.

The first preparing step (S60) includes preparing a front surface protection member (110) having front surface wiring patterns (111) connectable to the ends of the first conductive paste of the first insulator that do not face the second insulator and connectable to the ends of the second conductive paste protruding from the third via holes of the second insulator.

The second preparing step (S70) includes preparing a rear surface protection member (120) having rear surface wiring patterns (121) connectable to the other ends of the first conductive paste protruding from the first via holes of the first insulator and connectable to the other ends of the second conductive paste of the second insulator that do not face the first insulator.

The third forming step (S80) includes inserting the parts of the first conductive paste protruding from the first via holes into the fourth via holes, and inserting the parts of the second conductive paste protruding from the third via holes into the second via holes. The third forming step further includes arranging the front surface protection member having the front surface wiring patterns on the first insulator such that the front surface protection member does not face the second insulator, and arranging the rear surface protection member having the rear surface wiring patterns on the second insulator such that the rear surface protection member does not face the first insulator, thereby forming a stacked body.

The pressure bonding step (S90) includes forming first and second conductors by heating the stacked body while pressing the stacked body in the stacking direction and by solid-phase sintering of the first and the second conductive pastes.

The pressure bonding step further includes electrically connecting the first conductor, the second conductor, the front surface wiring patterns, and the rear surface wiring patterns, and bonding the first insulator, the second insulator, the front surface protection member, and the rear surface protection member together under pressure.

Accordingly, with the method of manufacturing a thermoelectric conversion device according to the present disclosure, in the state where the first and second insulators and the like are stacked, the first conductive paste protrudes from the second insulator toward the rear surface protection member, and the second conductive paste protrudes from the first insulator toward the front surface protection member. In this state, the stacked body is heated while being pressed in the stacking direction, and loads are efficiently applied from the front and rear surface wiring patterns to the first and second conductive pastes. Therefore, the first and second conductive pastes are solid-phase sintered, and become the first and second conductors, respectively. Thus, with the method of manufacturing a thermoelectric conversion device according to the present disclosure, each of the first and second insulators can be formed using a thermoplastic resin with a high melting point or a thermosetting resin. As a result, a thermoelectric conversion device with high heat resistance can be manufactured.

A thermoelectric conversion device as an aspect of the technique of the present disclosure includes a first insulator (11), a second insulator (12), a plurality of first conductors (130), a plurality of second conductors (140), front surface wiring patterns (111), rear surface wiring patterns (121), a front surface protection member (110), and a rear surface protection member (120).

The first insulator has a plate-like shape and has first and second via holes (101, 102). The second insulator has a plate-like shape and has third via holes (103) whose internal width is smaller than that of the second via holes and fourth via holes (104) whose internal width is larger than that of the first via holes. The second insulator is stacked on the first insulator in its thickness direction. The plurality of first conductors are embedded in the first via holes of the first insulator and the fourth via holes of the second insulator and have a certain thermopower (first thermopower). The plurality of second conductors are embedded in the second via holes of the first insulator and the third via holes of the second insulator and have a thermopower (second thermopower) different from that of the first conductors. The front surface wiring patterns are connected, in the first insulator, to the ends of the first conductors that do not face the second insulator and to the ends of the second conductors. The rear surface wiring patterns are connected, in the second insulator, to the other ends of the first conductors that do not face the first insulator and to the other ends of the second conductors. The front surface protection member covers the surface of the first insulator that does not face the second insulator and the front surface wiring patterns. The rear surface protection member covers the surface of the second insulator that does not face the first insulator and the rear surface wiring patterns.

Accordingly, a thermoelectric conversion device can be manufactured using the above-mentioned manufacturing method. As a result, the thermoelectric conversion device with high heat resistance can be obtained.

Note that reference signs in parentheses for the above components indicate example correspondence relations with specific components described in the following embodiments.

DRAWINGS

DESCRIPTION

Hereinafter, embodiments of the technique of the present disclosure will be described on the basis of the drawings. In the following embodiments, components that are identical or equivalent to each other are denoted by the same reference sign for the sake of explanation.

FIRST EMBODIMENT

Figure 1:
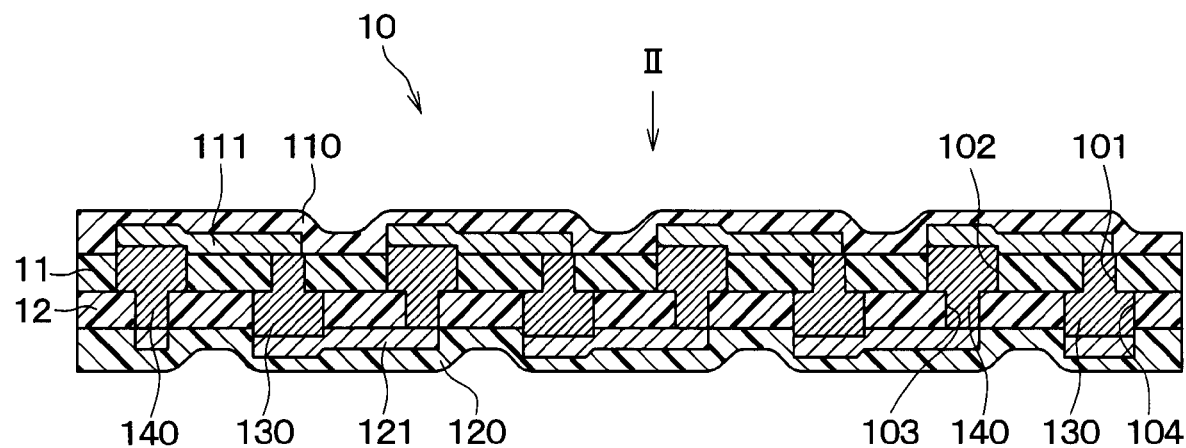
FIG. 1 is a view illustrating a cross-sectional configuration of a thermoelectric conversion device according to the first embodiment.
Figure 2:
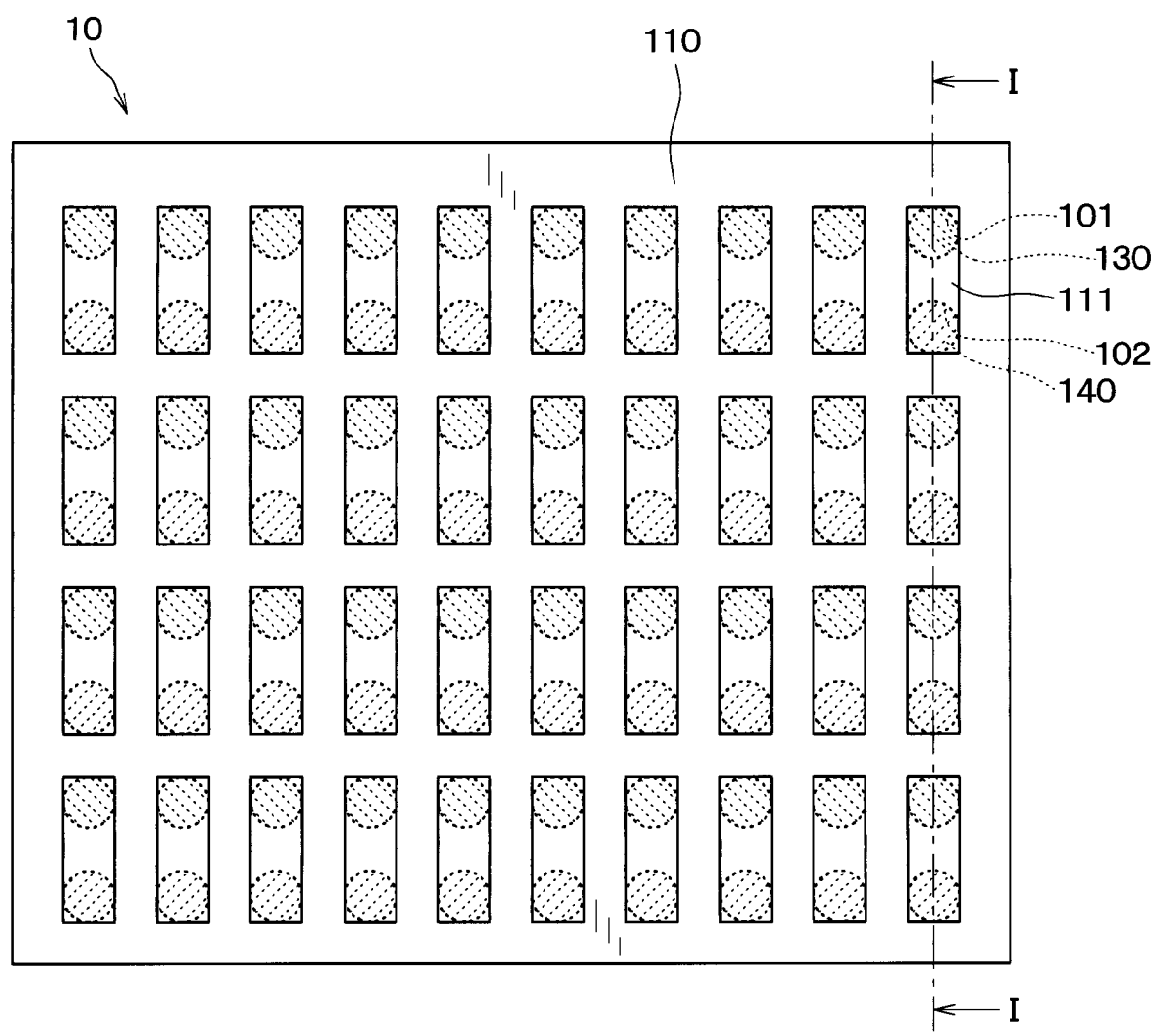
FIG. 2 is a plan view taken in direction II of FIG. 1.

The first embodiment of the present disclosure will be described with reference to the drawings. As illustrated in FIGS. 1 and 2, a thermoelectric conversion device 10 according to the present embodiment integrally includes a first insulator 11, a second insulator 12, a front surface protection member 110, and a rear surface protection member 120. The thermoelectric conversion device 10 includes a plurality of interlayer connection members 130 and 140 embedded therein, and the plurality of interlayer connection members 130 and 140 are alternately connected in series by front surface wiring patterns 111 and rear surface wiring patterns 121. The interlayer connection members 130 and 140 in the present embodiment correspond to "conductors".

In FIG. 2, the front surface protection member 110 is regarded as transparent or translucent, and the positions of the plurality of front surface wiring patterns 111 are indicated by solid lines. In FIG. 2, for the convenience of explanation, the interlayer connection members 130 and 140 are hatched with broken lines, and the outer peripheries thereof are indicated by broken lines.

First, a configuration of thermoelectric conversion device 10 will be described.

As illustrated in FIGS. 1 and 2, the first insulator 11 includes a flexible resin film and has a plate-like shape. The first insulator 11 is configured as follows using the method of manufacturing the thermoelectric conversion device 10 described later. Specifically, the first insulator 11 includes a thermoplastic resin with a melting point higher than the temperature for solid-phase sintering first and second conductive pastes 131 and 141 (refer to FIG. 15, etc.) or a thermosetting resin. The resin contained in the first insulator 11 can be, for example, an aramid resin with an adhesive layer.

The first insulator 11 has a plurality of first and second via holes 101 and 102 extending in the thickness direction. The first via holes 101 and the second via holes 102 are alternately provided in the surface direction of the first insulator 11.

The second insulator 12 includes a flexible resin film and has a plate-like shape in the same manner as the first insulator 11. The second insulator 12 is stacked on the first insulator 11 in its thickness direction. The second insulator 12 includes a thermoplastic resin with a melting point higher than the temperature for solid-phase sintering of the first and second conductive pastes 131 and 141 (described later) or a thermosetting resin. The resin contained in the second insulator 12 can be, for example, an aramid resin with an adhesive layer.

The second insulator 12 has a plurality of third and fourth via holes 103 and 104 extending in the thickness direction. The third via holes 103 and the fourth via holes 104 are alternately provided in the surface direction of the second insulator 12. The third via holes 103 of the second insulator 12 are provided at positions corresponding to the second via holes 102 of the first insulator 11. The fourth via holes 104 of the second insulator 12 are provided at positions corresponding to the first via holes 101 of the first insulator 11.

The internal width of the fourth via holes 104 of the second insulator 12 is larger than the internal width of the first via holes 101 of the first insulator 11. The internal width of the second via holes 102 of the first insulator 11 is larger than the internal width of the third via holes 103 of the second insulator 12. Note that the internal width of the first via holes 101 of the first insulator 11 is substantially equal to the internal width of the third via holes 103 of the second insulator 12. The internal width of the second via holes 102 of the first insulator 11 is substantially equal to the internal width of the fourth via holes 104 of the second insulator 12.

A plurality of first interlayer connection members 130 are embedded in the first via holes 101 of the first insulator 11 and the fourth via holes 104 of the second insulator 12. In addition, a plurality of second interlayer connection members 140 are embedded in the second via holes 102 of the first insulator 11 and the third via holes 103 of the second insulator 12.

The first interlayer connection members 130 and the second interlayer connection members 140 include thermoelectric materials such as metals and semiconductors having different thermopowers so as to exhibit the Seebeck effect. For example, the first interlayer connection members 130 each include a metallic compound that contains solid-phase sintered p-type Bi—Sb—Te alloy powder so as to maintain the original crystal structure of a plurality of metallic atoms. For example, the second interlayer connection members 140 each include a metallic compound that contains solid-phase sintered n-type Bi—Te alloy powder so as to maintain the original crystal structure of a plurality of metallic atoms.

The surface of the first insulator 11 that does not face the second insulator 12 is covered with the front surface protection member 110 provided with the front surface wiring patterns 111. In other words, the front surface protection member 110 covers the surface of the first insulator 11 that does not face the second insulator 12 and the front surface wiring patterns 111. The front surface protection member 110 includes a flexible resin film and has a plate-like shape in the same manner as the first insulator 11. The front surface protection member 110 includes a thermoplastic resin with a melting point higher than the temperature for solid-phase sintering of the first and second conductive pastes 131 and 141 (described later) or a thermosetting resin. The resin contained in the front surface protection member 110 can be, for example, an aramid resin with an adhesive layer.

The front surface wiring patterns 111 are patterned using copper foil or the like, and provided on the surface of the front surface protection member 110. The plurality of front surface wiring patterns 111 are electrically connected, in the first insulator 11, to the ends of the first interlayer connection members 130 that do not face the second insulator 12 and to the ends of the second interlayer connection members 140 adjacent thereto.

The surface of the second insulator 12 that does not face the first insulator 11 is covered with the rear surface protection member 120 provided with the rear surface wiring patterns 121. In other words, the rear surface protection member 120 covers the surface of the second insulator 12 that does not face the first insulator 11 and the rear surface wiring patterns 121. The rear surface protection member 120 includes a flexible resin film and has a plate-like shape in the same manner as the first insulator 11. The rear surface protection member 120 includes a thermoplastic resin with a melting point higher than the temperature for solid-phase sintering of the first and second conductive pastes 131 and 141 (described later) or a thermosetting resin. The resin contained in the rear surface protection member 120 can be, for example, an aramid resin with an adhesive layer.

The rear surface wiring patterns 121 are patterned using copper foil or the like, and provided on the surface of the rear surface protection member 120. The plurality of rear surface wiring patterns 121 are electrically connected, in the second insulator 12, to the other ends of the first interlayer connection members 130 that do not face the first insulator 11 and to the other ends of the second interlayer connection members 140 adjacent thereto.

The first and second interlayer connection members 130 and 140 adjacent to each other are connected by the front and rear surface wiring patterns 111 and 121 in an alternate folding manner. In this manner, the first and second interlayer connection members 130 and 140 are connected in series by the front and rear surface wiring patterns 111 and 121. Note that the ends of the front surface wiring patterns 111 or rear surface wiring patterns 121 that connect the first and second interlayer connection members 130 and 140 in series are directly exposed to outside air. Alternatively, the ends of the front surface wiring patterns 111 or rear surface wiring patterns 121 are exposed to outside air through metal members (not illustrated) or the like. The exposed parts serve as electrical connections between the thermoelectric conversion device 10 and an external detection device (not illustrated).

The heat flux that flows between one surface and the other surface of the thermoelectric conversion device 10 in the thickness direction causes a difference in temperature between one end and the other end of each of the first and second interlayer connection members 130 and 140. At this time, thermoelectric force is generated by the Seebeck effect in the first and second interlayer connection members 130 and 140. The thermoelectric conversion device 10 outputs the generated thermoelectric force as a sensor signal (e.g., voltage signal).

Next, a method of manufacturing the thermoelectric conversion device 10 will be described.

Figure 3:
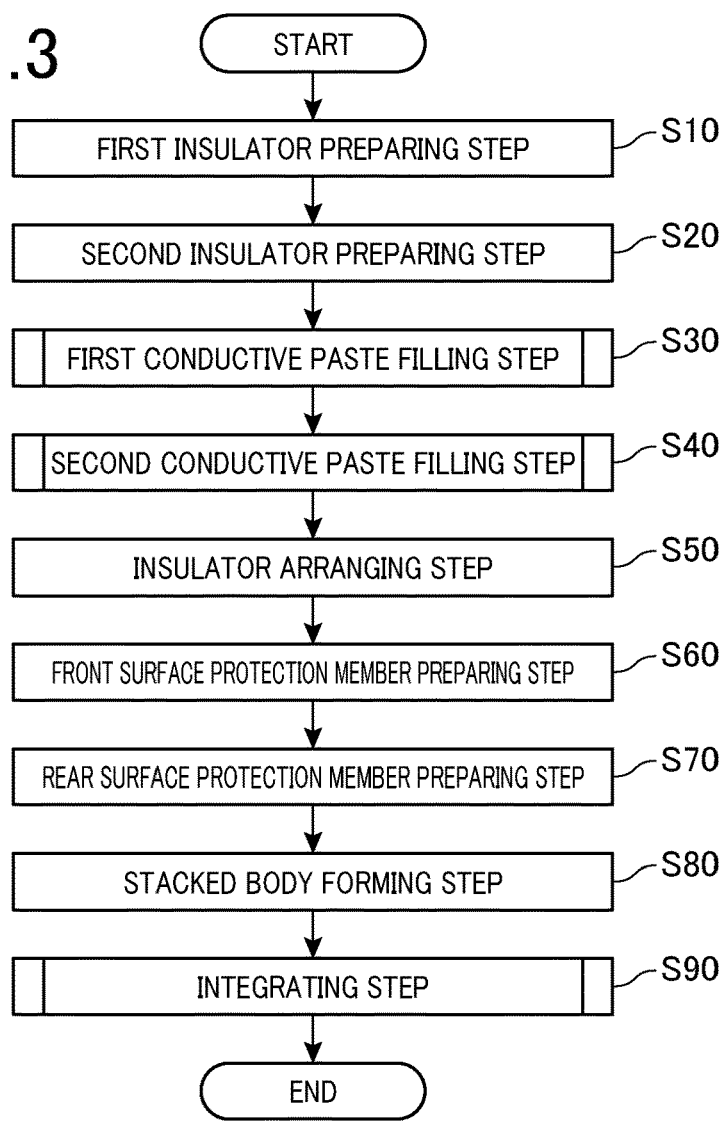
FIG. 3 is a flowchart illustrating a method of manufacturing a thermoelectric conversion device.

As illustrated in FIG. 3, the manufacturing method according to the present embodiment includes a first insulator preparing step (S10), a second insulator preparing step (S20), a first conductive paste filling step (S30), and a second conductive paste filling step (S40). The manufacturing method according to the present embodiment also includes an insulator arranging step (S50), a front surface protection member preparing step (S60), a rear surface protection member preparing step (S70), a stacked body forming step (S80), and an integrating step (S90).

In the first insulator preparing step (S10), the abovementioned first insulator 11 is prepared. Then, drill working, laser working, or the like is performed on the prepared first insulator 11. Consequently, the first via holes 101 and the second via holes 102 are formed in the first insulator preparing step (S10). The first insulator preparing step (S10) in the present embodiment corresponds to a "first forming step".

In the second insulator preparing step (S20), the abovementioned second insulator 12 is prepared. Then, drill working, laser working, or the like is performed on the prepared second insulator 12. Consequently, the third via holes 103 and the fourth via holes 104 are formed in the second insulator preparing step (S20). The second insulator preparing step (S20) in the present embodiment corresponds to a "second forming step".

Note that, as described above, the internal width of the fourth via holes 104 of the second insulator 12 is larger than the internal width of the first via holes 101 of the first insulator 11. The internal width of the second via holes 102 of the first insulator 11 is larger than the internal width of the third via holes 103 of the second insulator 12.

Next, the first conductive paste filling step S30 of the method of manufacturing the thermoelectric conversion device 10 will be described.

Figure 4:
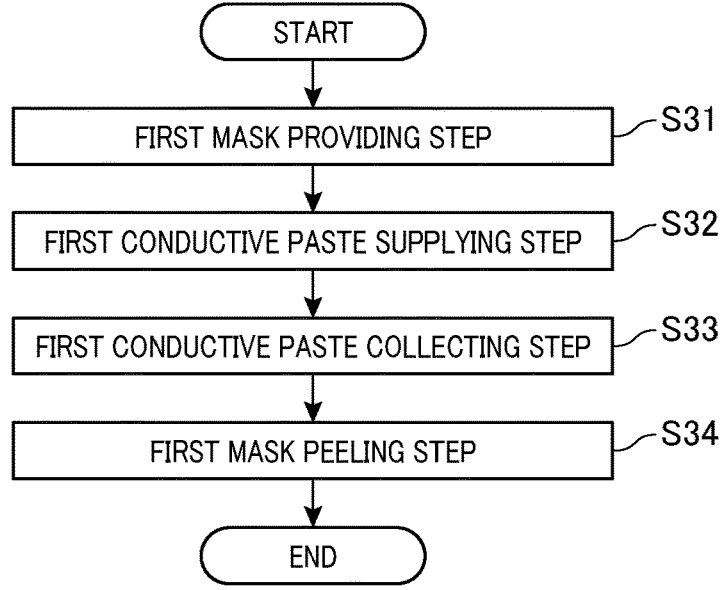
FIG. 4 is a flowchart illustrating the method of manufacturing a thermoelectric conversion device.

The first conductive paste filling step (S30) is the step of filling the first via holes 101 of the first insulator 11 with the first conductive paste 131. The first conductive paste filling step (S30) in the present embodiment corresponds to a "first filling step". As illustrated in FIG. 4, the first conductive paste filling step (S30) includes a first mask providing step (S31), a first conductive paste supplying step (S32), a first conductive paste collecting step (S33), a first mask peeling step (S34), and the like. Note that, for example, the conductive material filling device described in JP 2010-50356 A can be used as a device for performing the first conductive paste filling step (S30).

Figure 6:
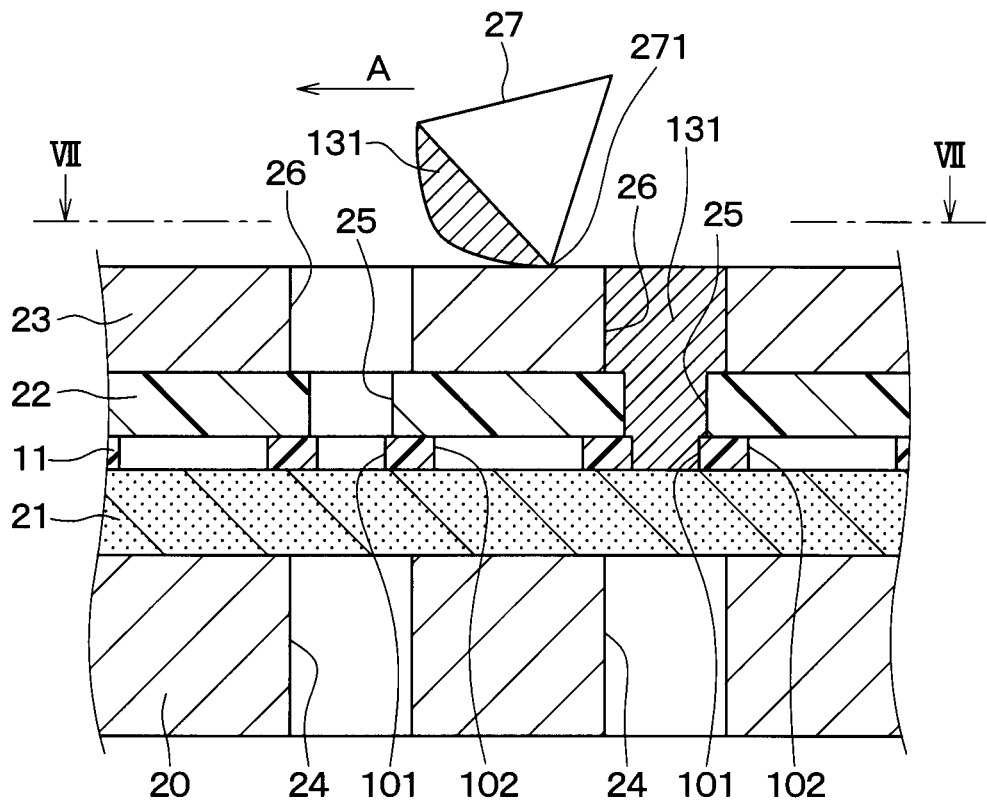
FIG. 6 is a view for explaining the method of manufacturing a thermoelectric conversion device.

First, in the first mask providing step (S31), the following members are arranged on an adsorbing metal plate 20 of a conductive material filling device (not illustrated) as illustrated in FIG. 6. Specifically, in the first mask providing step (S31), adsorbing paper 21, the first insulator 11, a first mask 22, and a first metal mask 23 are arranged on the adsorbing metal plate 20 in this order.

A plurality of holes 24 are provided in the adsorbing metal plate 20. The space below the plurality of holes 24 is connected to a vacuum pump (not illustrated). The adsorbing metal plate 20 is heated by a heater (not illustrated).

The adsorbing paper 21 arranged on the adsorbing metal plate 20 can be any material that adsorbs solvents used for the conductive pastes 131 and 141 (described later). For example, commonly available high-quality paper is used as the adsorbing paper 21. The first insulator 11 including the first and second via holes 101 and 102 is arranged on the adsorbing paper 21.

The first mask 22 is arranged on the first insulator 11. The thickness of the first mask 22 is larger than the thickness of the second insulator 12. The first mask 22 has first mask holes 25 at positions corresponding to the first via holes 101. The capacity of the first mask holes 25 is larger than the capacity of the fourth via holes 104 of the second insulator 12. Note that the material for the first mask 22 can be, for example, an aramid resin.

The first metal mask 23 is arranged on the first mask 22. The first metal mask 23 may have any thickness as long as the first metal mask 23 is rigid enough to withstand the friction of a filling squeegee in the first conductive paste supplying step (S32) described later. The first metal mask 23 has first metal mask holes 26 at positions corresponding to the first mask holes 25. Consequently, in the first mask providing step (S31), the adsorbing paper 21, the first insulator 11, the first mask 22, and the first metal mask 23 are arranged on the adsorbing metal plate 20 in this order.

Figure 7:
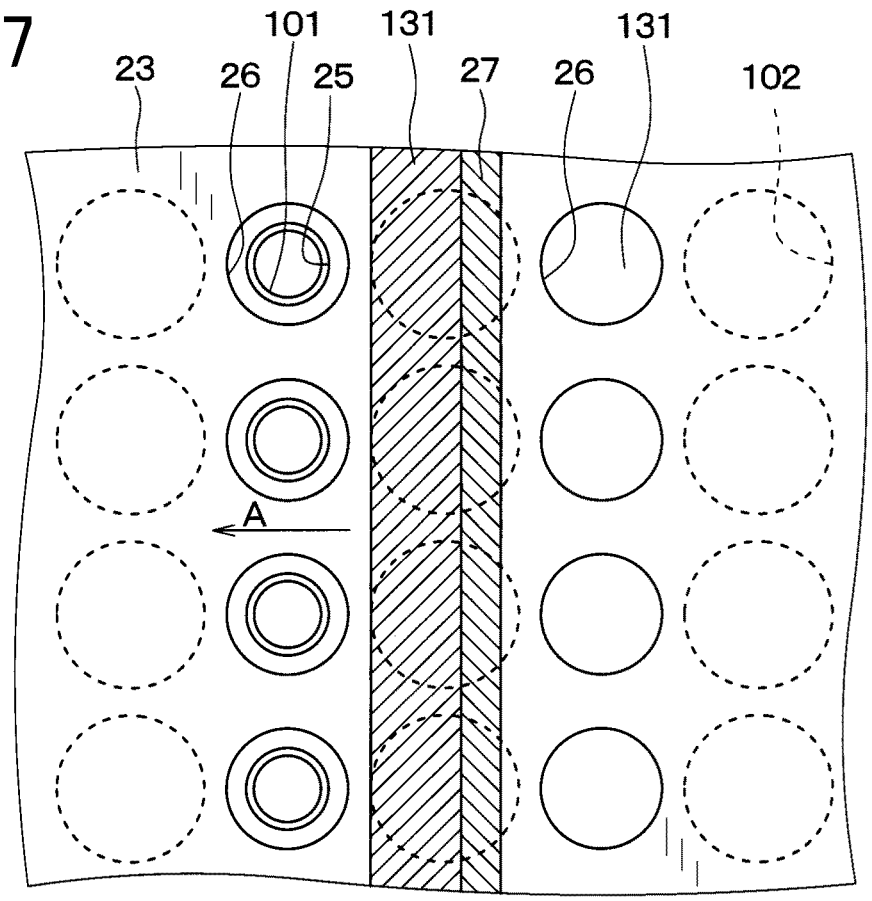
FIG. 7 is a view on arrow VII-VII in FIG. 6.

Next, in the first conductive paste supplying step (S32), a filling squeegee 27 is moved in the direction of arrow A on the first metal mask 23 as illustrated in FIGS. 6 and 7. Then, the first conductive paste 131 is discharged from the filling squeegee 27. At this time, a rear end 271 of the filling squeegee 27 relative to its moving direction is moved in contact with the upper surface of the first metal mask 23.

Consequently, the first conductive paste 131 is rubbed into the first via holes 101 through the first metal mask holes 26 and the first mask holes 25 from above the first metal mask 23. Note that any excess first conductive paste 131 is rubbed off using the end 271 of the filling squeegee 27.

The first conductive paste 131 can be made, for example, by adding Bi—Sb—Te alloy fine powder whose metallic atoms maintain a certain crystal structure to an organic solvent such as paraffin so that a paste is obtained.

During the first conductive paste supplying step (S32), the first insulator 11, the first mask 22, and the first metal mask 23 are heated by the above-mentioned heater to a temperature higher than the melting point of the organic solvent contained in the first conductive paste 131. Consequently, in the first conductive paste supplying step (S32), the first conductive paste 131 is supplied into the first metal mask holes 26, the first mask holes 25, and the first via holes 101 with its organic solvent melted.

During the first conductive paste supplying step (S32), the first metal mask holes 26, the first mask holes 25, and the first via holes 101 are evacuated by the above-mentioned vacuum pump. Consequently, in the first conductive paste supplying step (S32), no voids are included in the first conductive paste 131 within the first metal mask holes 26, the first mask holes 25, and the first via holes 101.

In the first conductive paste supplying step (S32), most of the organic solvent contained in the first conductive paste 131 supply into the first metal mask holes 26, the first mask holes 25, and the first via holes 101 is adsorbed by the adsorbing paper 21. Therefore, in the first conductive paste supplying step (S32), the first conductive paste 131 is supplied into the first metal mask holes 26, the first mask holes 25, and the first via holes 101 from above the first metal mask 23, with its alloy fine powder densely packed.

Figure 8:
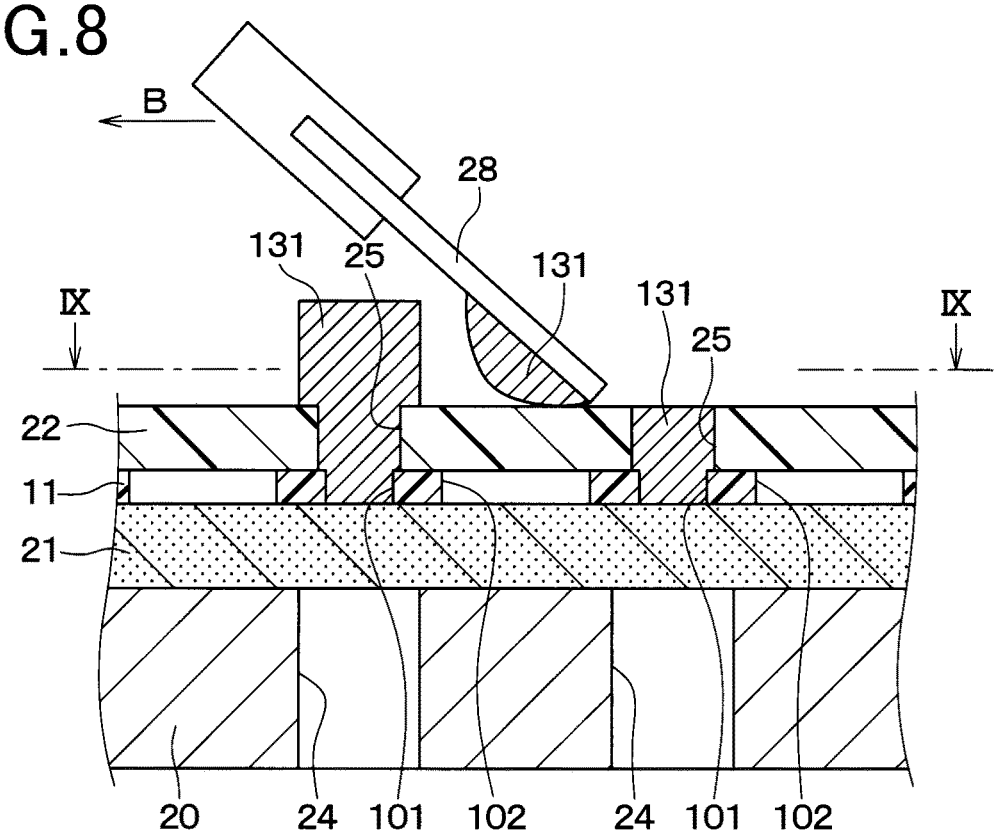
FIG. 8 is a view for explaining the method of manufacturing a thermoelectric conversion device.
Figure 9:
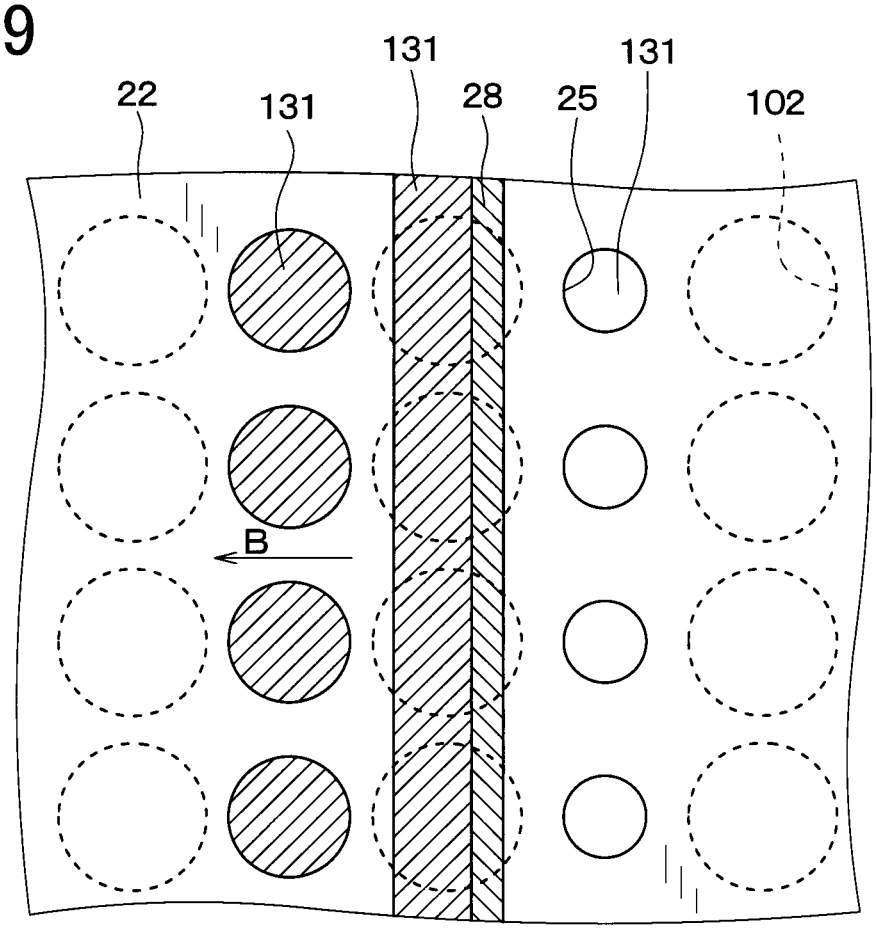
FIG. 9 is a view on arrow IX-IX in FIG. 8.

Next, in the first conductive paste collecting step (S33), the first metal mask 23 is removed from the upper surface of the first mask 22 as illustrated in FIGS. 8 and 9. Consequently, the first conductive paste 131 within the first metal mask holes 26 protrudes from the upper surface of the first mask 22. Subsequently, in the first conductive paste collecting step (S33), a metal squeegee 28 is moved in the direction of arrow B on the first mask 22. Then, the first conductive paste 131 protruding from the first mask 22 is scraped off.

Figure 10:
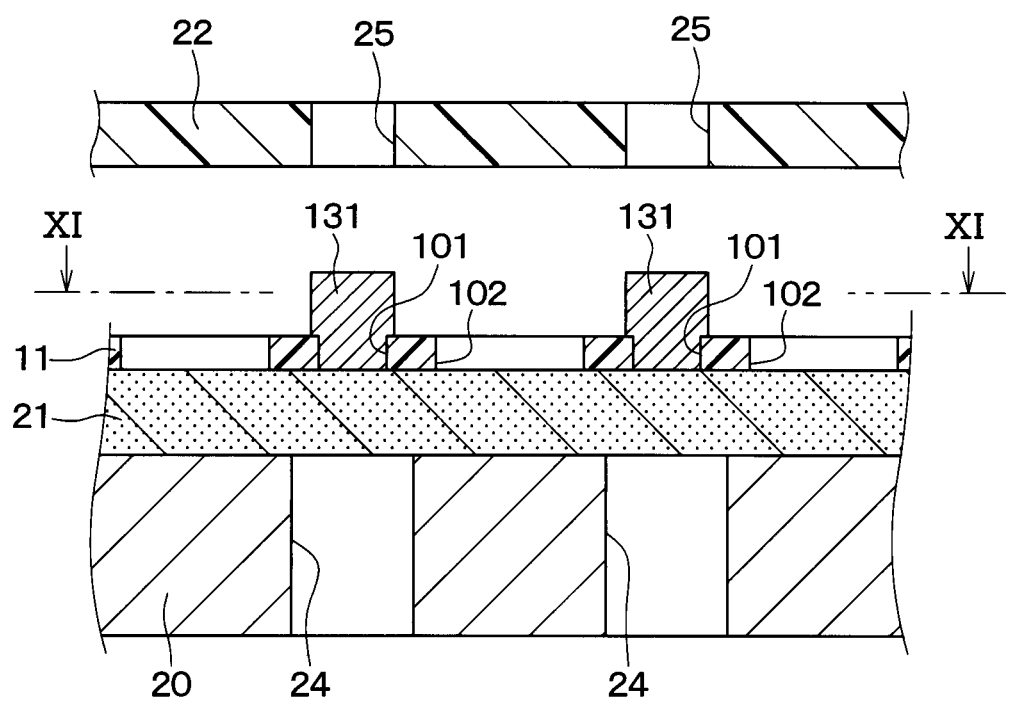
FIG. 10 is a view for explaining the method of manufacturing a thermoelectric conversion device.
Figure 11:
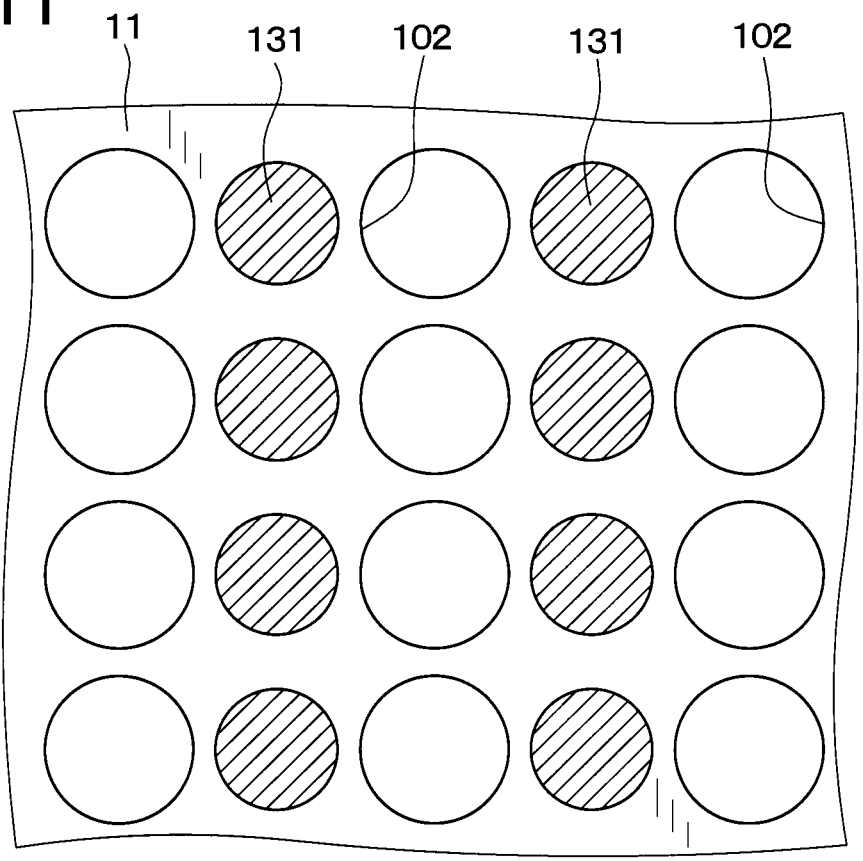
FIG. 11 is a view on arrow XI-XI in FIG. 10.

Next, in the first mask peeling step (S34), the first mask 22 is removed from the first insulator 11 as illustrated in FIGS. 10 and 11. Consequently, the first conductive paste 131 within the first via holes 101 of the first insulator 11 protrudes from the first via holes 101 by the thickness of the first mask 22. As described above, the thickness of the first mask 22 is larger than the thickness of the second insulator 12. Therefore, the first conductive paste 131 protrudes from the first via holes 101 by an amount larger than the thickness of the second insulator 12. As described above, the capacity of the first mask holes 25 of the first mask 22 is larger than the capacity of the fourth via holes 104 of the second insulator 12. Therefore, the volume of the parts of the first conductive paste 131 protruding from the first via holes 101 is larger than the capacity of the fourth via holes 104 of the second insulator 12.

Figure 5:
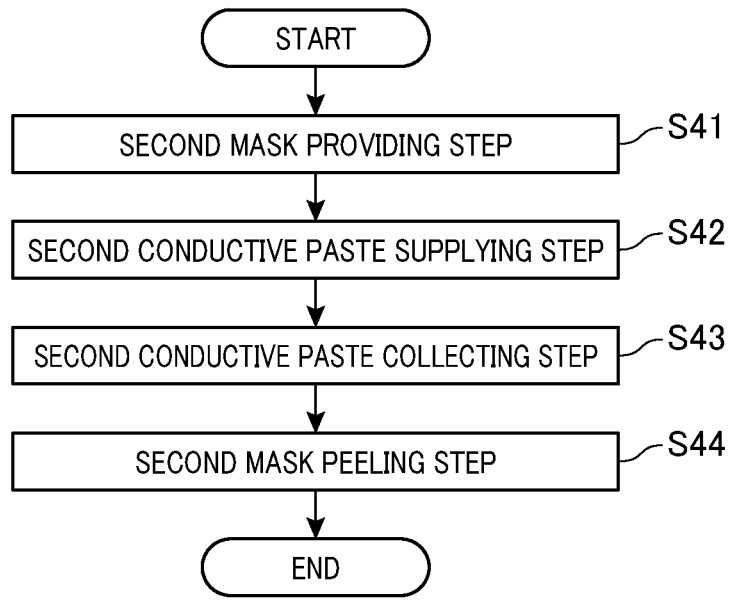
FIG. 5 is a flowchart illustrating the method of manufacturing a thermoelectric conversion device.

Next, the second conductive paste filling step (S40) of the method of manufacturing the thermoelectric conversion device 10 will be described. The second conductive paste filling step (S40) is the step of filling the second via holes 102 of the second insulator 12 with the second conductive paste 141. The second conductive paste filling step (S40) in the present embodiment corresponds to a "second filling step". As illustrated in FIG. 5, the second conductive paste filling step (S40) includes a second mask providing step (S41), a second conductive paste supplying step (S42), a second conductive paste collecting step (S43), a second mask peeling step (S44), and the like.

Figure 12:
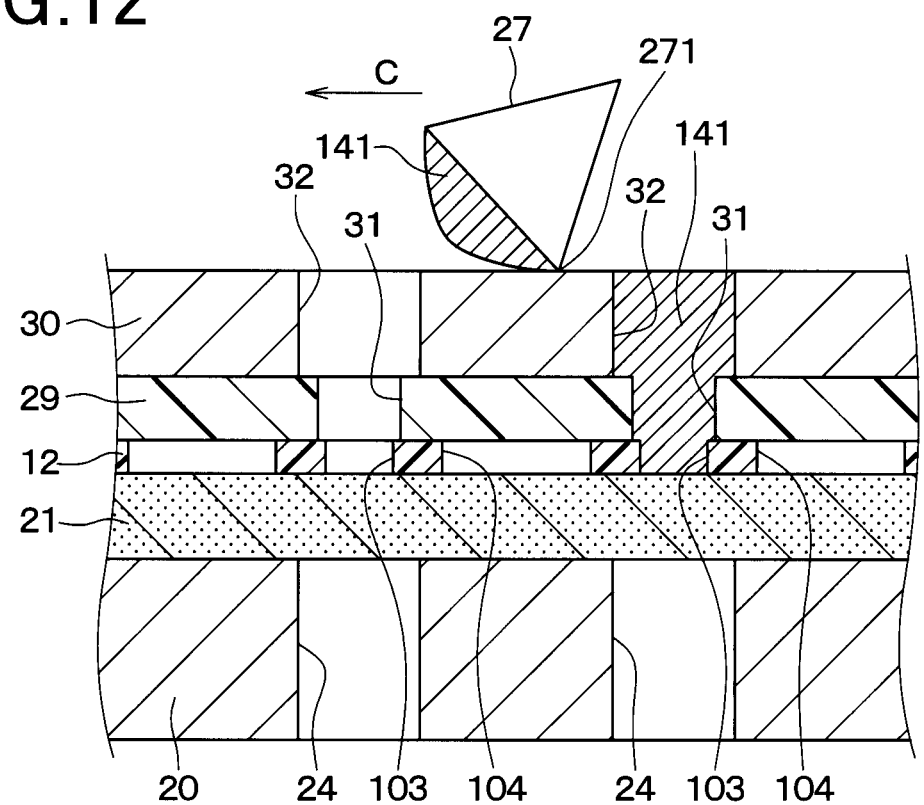
FIG. 12 is a view for explaining the method of manufacturing a thermoelectric conversion device.

First, in the second mask providing step S41, the following members are arranged on the adsorbing metal plate 20 of the conductive material filling device as illustrated in FIG. 12. Specifically, in the second mask providing step (S41), the adsorbing paper 21, the second insulator 12, a second mask 29, and a second metal mask 30 are arranged on the adsorbing metal plate 20 in this order. The thickness of the second mask 29 arranged on the second insulator 12 is larger than the thickness of the first insulator 11. The second mask 29 has second mask holes 31 at positions corresponding to the third via holes 103. The capacity of the second mask holes 31 is larger than the capacity of the second via holes 102 of the first insulator 11. Note that the material for the second mask 29 can be, for example, an aramid resin.

The second metal mask 30 arranged on the second mask 29 has second metal mask holes 32 at positions corresponding to the second mask holes 31.

Next, in the second conductive paste supplying step (S42), the above-mentioned heater and vacuum pump are driven, and the filling squeegee 27 is moved in the direction of arrow C on the second metal mask 30 as illustrated in FIG. 12. Then, the second conductive paste 141 is discharged from the filling squeegee 27. The second conductive paste 141 can be made, for example, by adding Bi—Te alloy fine powder whose metallic atoms maintain a certain crystal structure to an organic solvent such as paraffin so that a paste is obtained. In the second conductive paste supplying step (S42), most of the organic solvent contained in the second conductive paste 141 supply into the second metal mask holes 32, the second mask holes 31, and the third via holes 103 is adsorbed by the adsorbing paper 21. Therefore, in the second conductive paste supplying step (S42), the second conductive paste 141 is supplied into the second metal mask holes 32, the second mask holes 31, and the third via holes 103 from above the second metal mask 30, with its alloy fine powder densely packed.

Figure 13:
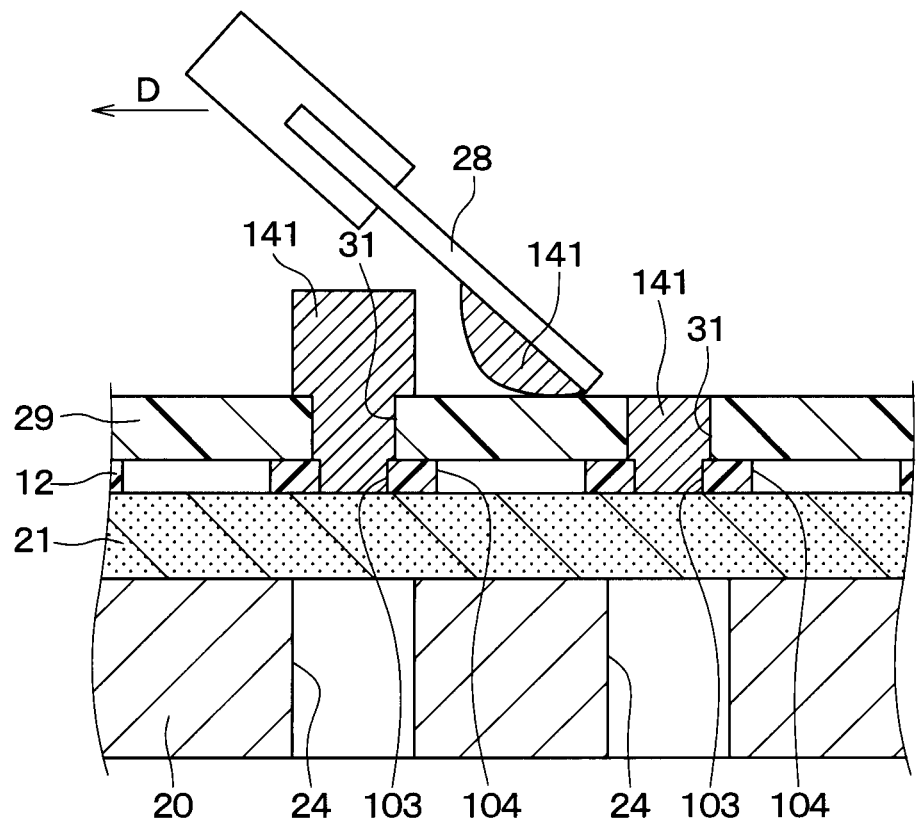
FIG. 13 is a view for explaining the method of manufacturing a thermoelectric conversion device.

Next, in the second conductive paste collecting step (S43), the second metal mask 30 is removed from the upper surface of the second mask 29 as illustrated in FIG. 13. Consequently, the second conductive paste 141 within the second metal mask holes 32 protrudes from the upper surface of the second mask 29. Subsequently, in the second conductive paste collecting step (S43), the metal squeegee 28 is moved in the direction of arrow D on the second mask 29. Then, the second conductive paste 141 protruding from the second mask 29 is scraped off.

Figure 14:
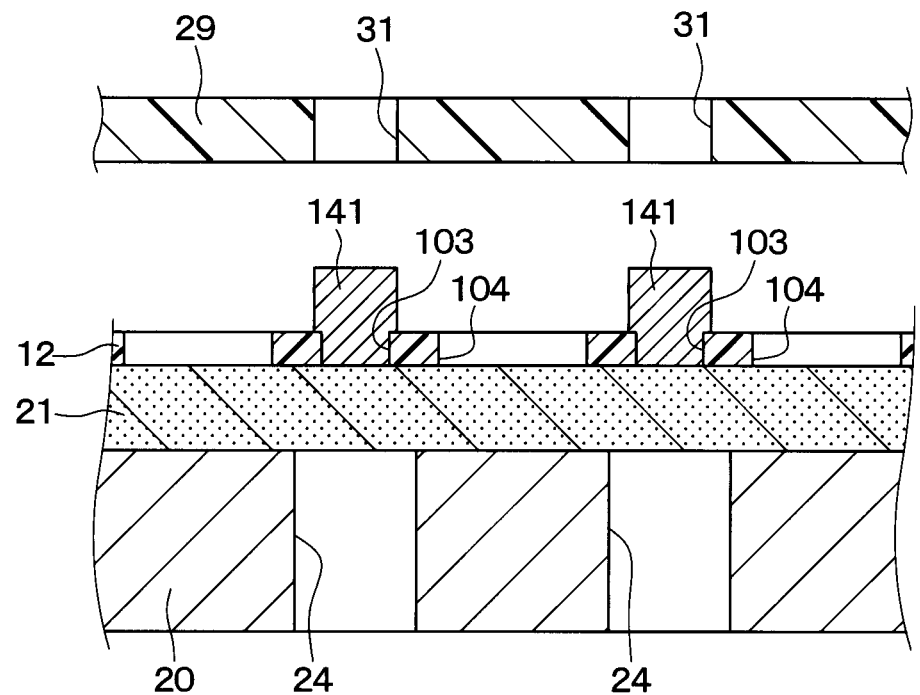
FIG. 14 is a view for explaining the method of manufacturing a thermoelectric conversion device.

Next, in the second mask peeling step (S44), the second mask 29 is removed from the second insulator 12 as illustrated in FIG. 14. Consequently, the second conductive paste 141 within the third via holes 103 of the second insulator 12 protrudes from the third via holes 103 by the thickness of the second mask 29. As described above, the thickness of the second mask 29 is larger than the thickness of the first insulator 11. Therefore, the second conductive paste 141 protrudes from the third via holes 103 by an amount larger than the thickness of the first insulator 11. As described above, the capacity of the second mask holes 31 of the second mask 29 is larger than the capacity of the second via holes 102 of the first insulator 11. Therefore, the volume of the parts of the second conductive paste 141 protruding from the third via holes 103 is larger than the capacity of the second via holes 102 of the first insulator 11.

Next, the insulator arranging step (S50) of the method of manufacturing the thermoelectric conversion device 10 will be described.

Figure 15:
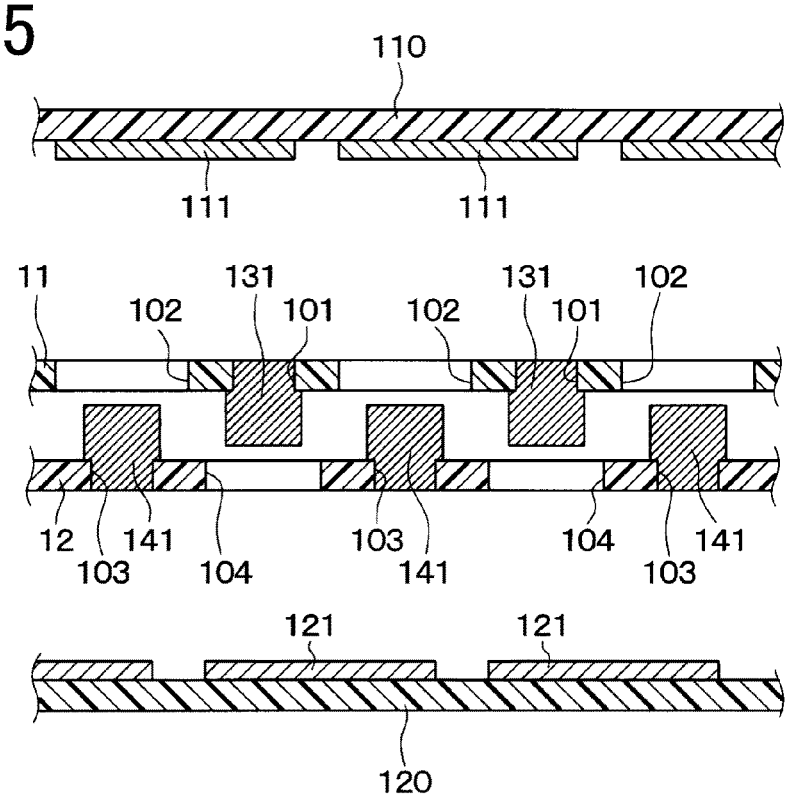
FIG. 15 is a view for explaining the method of manufacturing a thermoelectric conversion device.

In the insulator arranging step (S50), the first insulator 11 is arranged such that the parts of the first conductive paste 131 protruding from the first via holes 101 face the fourth via holes 104 of the second insulator 12 as illustrated in FIG. 15. Similarly, the second insulator 12 is arranged such that the parts of the second conductive paste 141 protruding from the third via holes 103 face the second via holes 102 of the first insulator 11.

Next, the front surface protection member preparing step (S60) will be described.

In the front surface protection member preparing step (S60), the front surface protection member 110 having the front surface wiring patterns 111 is prepared as illustrated in FIG. 15. The front surface wiring patterns 111 are arranged in the above-mentioned insulator arranging step (S50) in the following manner. Specifically, the front surface wiring patterns 111 are arranged at positions where they are connectable to the ends of the first conductive paste 131 of the first insulator 11 that do not face the second insulator 12 and connectable to the ends of the second conductive paste 141 protruding from the third via holes 103 of the second insulator 12. The method of manufacturing the front surface wiring patterns 111 and the front surface protection member 110 first includes forming copper foil or the like on at least the surface of the front surface protection member 110 that faces the first insulator 11. The method further includes patterning the copper foil appropriately. The front surface wiring patterns 111 are formed on the front surface protection member 110 with this method.

Next, the rear surface protection member preparing step (S70) will be described.

In the rear surface protection member preparing step (S70), the rear surface protection member 120 having the rear surface wiring patterns 121 is prepared. The rear surface wiring patterns 121 are arranged in the above-mentioned insulator arranging step (S50) in the following manner. Specifically, the rear surface wiring patterns 121 are arranged at positions where they are connectable to the other ends of the first conductive paste 131 protruding from the first via holes 101 of the first insulator 11 and connectable to the other ends of the second conductive paste 141 of the second insulator 12 that do not face the first insulator 11. The method of manufacturing the rear surface wiring patterns 121 and the rear surface protection member 120 first includes forming copper foil or the like on at least the surface of the rear surface protection member 120 that faces the second insulator 12. The method further includes patterning the copper foil appropriately. The rear surface wiring patterns 121 are formed on the rear surface protection member 120 with this method.

Next, the stacked body forming step (S80) will be described.

Figure 16:
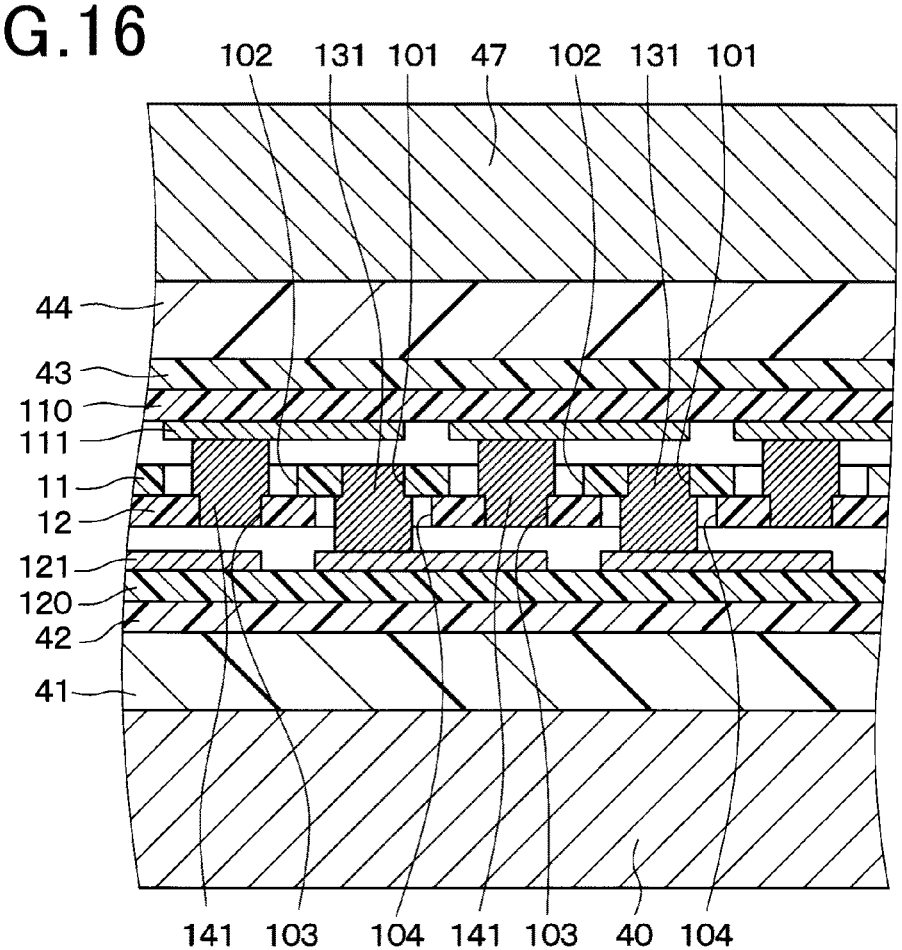
FIG. 16 is a view for explaining the method of manufacturing a thermoelectric conversion device.

In the stacked body forming step (S80), the following members are arranged on a lower pressing plate 40 of a pressing machine as illustrated in FIG. 16. Specifically, in the stacked body forming step (S80), a lower buffer 41, lower release paper 42, the rear surface protection member 120, the second insulator 12, the first insulator 11, the front surface protection member 110, upper release paper 43, and an upper buffer 44 are arranged on the lower pressing plate 40 in this order.

Note that the lower buffer 41 and the upper buffer 44 can be, for example, Teflon (registered trademark). The lower release paper 42 and the upper release paper 43 can be, for example, resin sheets formed of an aramid resin or the like.

The parts of the first conductive paste 131 protruding from the first via holes 101 of the first insulator 11 are inserted into the fourth via holes 104. The parts of the second conductive paste 141 protruding from the third via holes 103 of the second insulator 12 are inserted into the second via holes 102. The front surface protection member 110 is arranged such that the front surface wiring patterns 111 face the surface of the first insulator 11 that does not face the second insulator 12. The rear surface protection member 120 is arranged such that the rear surface wiring patterns 121 face the surface of the second insulator 12 that does not face the first insulator 11. Consequently, a stacked body is formed.

Next, the integrating step (S90) will be described.

Figure 17:
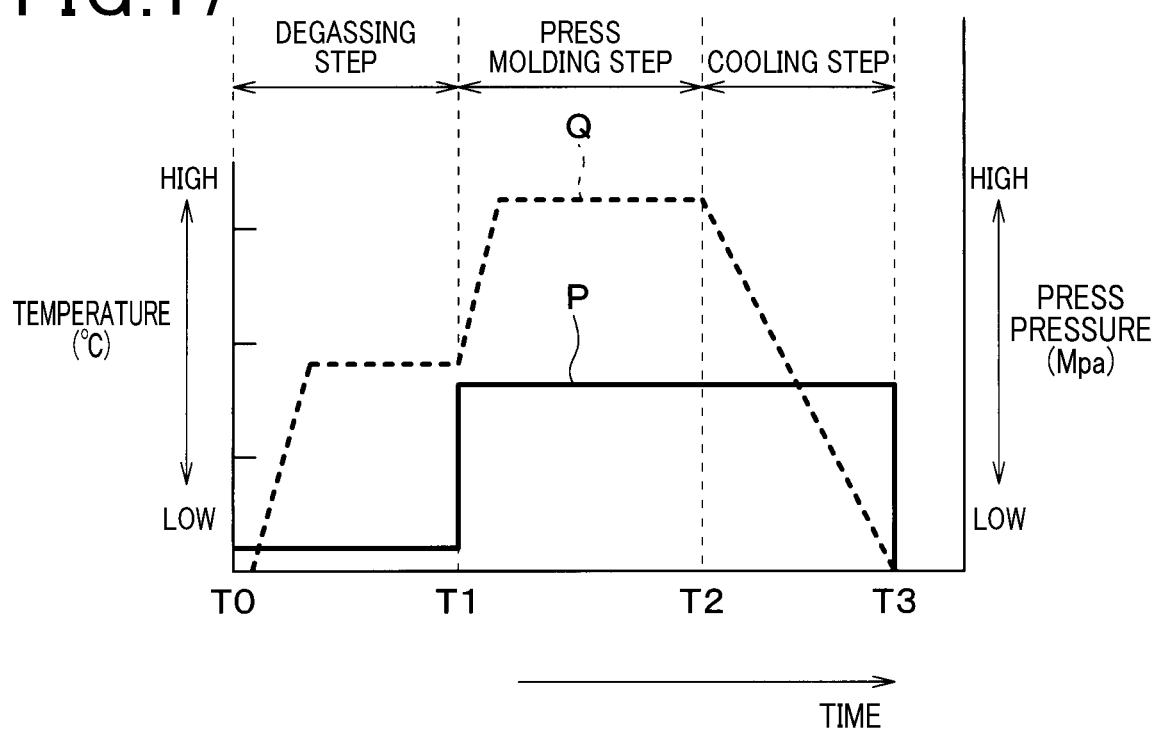
FIG. 17 is a graph illustrating press loads and temperatures for the method of manufacturing a thermoelectric conversion device.

In the integrating step (S90), the stacked body arranged between the lower pressing plate 40 and an upper pressing plate 47 of the pressing machine illustrated in FIG. 16 is heated while being pressed in the stacking direction in a vacuum. The integrating step (S90) includes a degassing step, a press molding step, a cooling step, and the like as illustrated in FIG. 17. In FIG. 17, the pressure (press pressure) applied to the stacked body and the temperature for heating the stacked body in the integrating step (S90) are indicated by solid line P and broken line Q, respectively.

As illustrated in FIG. 17, in the integrating step (S90), first, the degassing step is performed during the period from time T0 to time T1 (for example, for 600 seconds). In the degassing step, evacuation is performed with the vacuum pump, and the stacked body is heated at a temperature (for example, 180° C.) at which the first and second conductive pastes 131 and 141 do not become sintered. At the same time, a pressure (for example, 1.5 MPa) at which the first and second conductive pastes 131 and 141 become deformed is applied to the stacked body.

Figure 18:
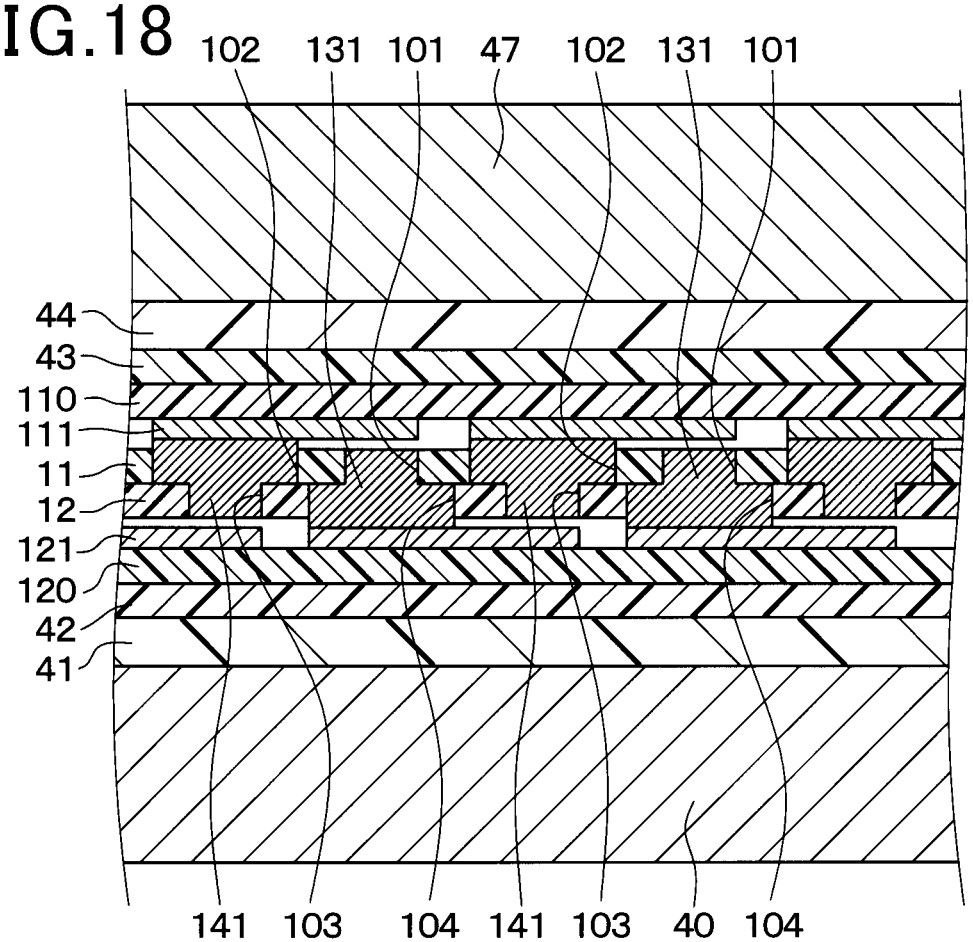
FIG. 18 is a view for explaining the method of manufacturing a thermoelectric conversion device.

Consequently, the fourth via holes 104 of the second insulator 12 are fully filled with the first conductive paste 131 as illustrated in FIG. 18. Similarly, the second via holes 102 of the first insulator 11 are fully filled with the second conductive paste 141. Meanwhile, the residual solvent that remains unadsorbed by the adsorbing paper 21 in the above-mentioned conductive paste filling steps (S30 and S40) is evaporated. Then, the vapor of the solvent is released from the first conductive paste 131 and the second conductive paste 141 by applying a vacuum.

As described above, the volume of the parts of the first conductive paste 131 protruding from the first via holes 101 of the first insulator 11 is larger than the capacity of the fourth via holes 104 of the second insulator 12. Therefore, parts of the first conductive paste 131 protrude from the surface of the second insulator 12 close to the rear surface protection member 120 in the direction away from the first insulator 11. Similarly, the volume of the parts of the second conductive paste 141 protruding from the third via holes 103 of the second insulator 12 is larger than the capacity of the second via holes 102 of the first insulator 11. Therefore, parts of the second conductive paste 141 protrude from the surface of the first insulator 11 close to the front surface protection member 110 in the direction away from the second insulator 12. Consequently, the front surface wiring patterns 111 and the second conductive paste 141 are brought into contact with each other, and gaps are provided between the front surface wiring patterns 111 and the first insulator 11. Similarly, the rear surface wiring patterns 121 and the first conductive past 131 are brought into contact with each other, and gaps are provided between the rear surface wiring patterns 121 and the second insulator 12.

As illustrated in FIG. 17, in the integrating step (S90), the press molding step is performed during the period from time T1 to time T2 (for example, for 600 seconds). In the press molding step, evacuation is performed with the vacuum pump, and the stacked body is heated and pressed at a certain temperature (for example, 320° C.) and a certain pressure (for example, 10 MPa). The temperature for this step is such that the first and second conductive pastes 131 and 141 become sintered. The pressure is such that the adhesive layers attached to the first insulator 11, the second insulator 12, the front surface protection member 110, and the rear surface protection member 120 bond with each other.

Figure 19:
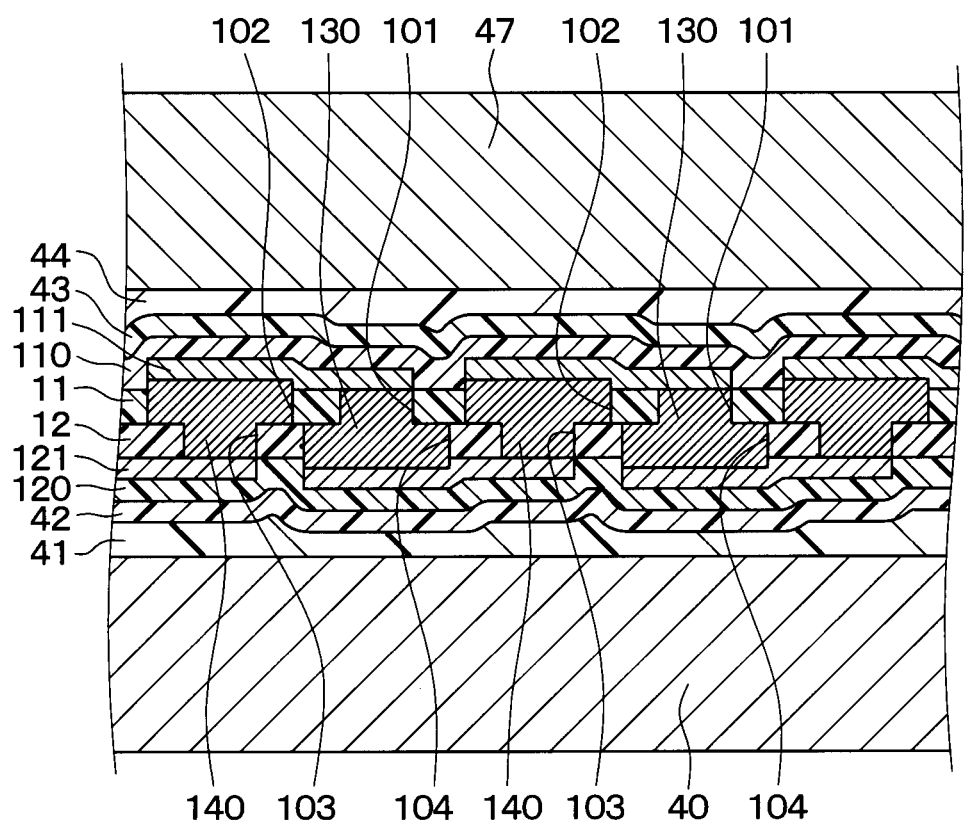
FIG. 19 is a view for explaining the method of manufacturing a thermoelectric conversion device.

As illustrated in FIG. 19, in the integrating step (S90), a load is applied from the lower pressing plate 40 to the rear surface protection member 120 through the lower release paper 42 and the lower buffer 41. A load is also applied from the upper pressing plate 47 to the front surface protection member 110 through the upper release paper 43 and the upper buffer 44. Consequently, the front surface protection member 110 and the front surface wiring patterns 111 are deformed toward the first insulator 11 at positions where no first conductive paste 131 is provided. Similarly, the rear surface protection member 120 and the rear surface wiring patterns 121 are deformed toward the second insulator 12 at positions where no second conductive paste 141 is provided. Therefore, in the lower and upper buffers 41 and 44, the amount of compression at positions where the first and second conductive pastes 131 and 141 are provided is larger than the amount of compression at positions where the first and second conductive pastes 131 and 141 are not provided.

As a result, in the integrating step (S90), loads are efficiently applied from the lower pressing plate 40 to the first and second conductive pastes 131 and 141 through the lower buffer 41, the lower release paper 42, the rear surface protection member 120, and the rear surface wiring patterns 121. Simultaneously, loads are efficiently applied from the upper pressing plate 47 to the first and second conductive pastes 131 and 141 through the upper buffer 44, the upper release paper 43, the front surface protection member 110, and the front surface wiring patterns 111. Therefore, the first and second conductive pastes 131 and 141 are solid-phase sintered, and become the first and second interlayer connection members 130 and 140, respectively. Then, the first and second interlayer connection members 130 and 140 are firmly connected to the front and rear surface wiring patterns 111 and 121. At the same time, the adhesive layers attached to the first insulator 11, the second insulator 12, the front surface protection member 110, and the rear surface protection member 120 are bonded together under pressure.

As illustrated in FIG. 17, in the integrating step (S90), the cooling step is performed during the period from time T2 to time T3 (for example, for 600 seconds). The cooling step includes continuing pressing the stacked body at a certain pressure (for example, 10 MPa) while lowering the temperature. Consequently, each member that constitutes the thermoelectric conversion device 10 is cooled, and the thermoelectric conversion device 10 is molded. After that, the lower pressing plate 40 and the upper pressing plate 47 are separated from the thermoelectric conversion device 10, and the thermoelectric conversion device 10 is taken out from the pressing machine. The thermoelectric conversion device 10 manufactured in this manner includes the first insulator 11, the second insulator 12, the front surface protection member 110, and the rear surface protection member 120, each containing a thermoplastic resin with a high melting point or a thermosetting resin. Thus, the thermoelectric conversion device 10 has a high heat resistance.

The present embodiment achieves the following effects.

(1) With the method of manufacturing the thermoelectric conversion device 10 according to the present embodiment, in the state where the first insulator 11, the second insulator 12, and the like are stacked, the first conductive paste 131 protrudes from the second insulator 12 toward the rear surface protection member 120. Similarly, the second conductive paste 141 protrudes from the first insulator 11 toward the front surface protection member 110. In this state, the stacked body is heated while being pressed in the stacking direction, and loads are efficiently applied from the front and rear surface wiring patterns 111 and 121 to the first and second conductive pastes 131 and 141. Therefore, the first and second conductive pastes 131 and 141 are solid-phase sintered, and become the first and second interlayer connection members 130 and 140, respectively. Thus, with the method of manufacturing the thermoelectric conversion device 10, each of the first and second insulators 11 and 12 can be formed using a thermoplastic resin with a high melting point or a thermosetting resin. As a result, the thermoelectric conversion device 10 with high heat resistance can be manufactured.

The thermoelectric conversion device 10 manufactured with the manufacturing method according to the present embodiment further includes the following characteristics.

(2) The thermoelectric conversion device 10 according to the present embodiment includes the first and second insulators 11 and 12, each containing a thermoplastic resin with a melting point higher than the temperature for solid-phase sintering of the first and second conductive pastes 131 and 141 or a thermosetting resin. Consequently, resin flow in the surface direction of the first and second insulators 11 and 12 can be prevented when the stacked body is heated while being pressed in the stacking direction. Thus, the thickness of the first and second insulators 11 and 12 of the thermoelectric conversion device 10 can be accurately set.

For example, suppose the thickness of the thermoelectric conversion device 10 is set to a large value so that the size of the first and second interlayer connection members 130 and 140 is increased. In this case, the output value of the thermoelectric conversion device 10 relative to heat flux can be increased.

Alternatively, for example, suppose the thickness of the thermoelectric conversion device 10 is set to a small value. In this case, the influence of airflow around a measurement target on the measurement of heat flow can be reduced.

(3) The thermoelectric conversion device 10 according to the present embodiment includes the first and second insulators 11 and 12, each containing a thermoplastic resin with a high melting point or a thermosetting resin. Consequently, resin flow in the surface direction of the first and second insulators 11 and 12 can be prevented when hot press working is performed multiple times. Thus, the shape of the thermoelectric conversion device 10 can be formed in accordance with the shape of a measurement target by performing hot press working one or more times after manufacturing the thermoelectric conversion device 10.

(4) The thermoelectric conversion device 10 according to the present embodiment includes the first and second insulators 11 and 12, each containing a thermoplastic resin with a high melting point or a thermosetting resin. Consequently, when the first to fourth via holes 101 to 104 are formed using drill working or the like, the first and second insulators 11 and 12 can be prevented from melting due to the heat (heat of the drill or the like) generated during the working. Therefore, the intervals between the via holes of the thermoelectric conversion device 10 can be narrowed, and the number of first and second interlayer connection members 130 and 140 per unit area can be increased. Thus, the output value of the thermoelectric conversion device 10 relative to heat flux can be increased.

(5) The thermoelectric conversion device 10 according to the present embodiment includes the first insulator 11, the second insulator 12, the front surface protection member 110, and the rear surface protection member 120, each containing the same type of resin (e.g., aramid resin or the like). Therefore, these resins are firmly bonded together in the integrating step (S90) of the method of manufacturing the thermoelectric conversion device 10.
Consequently, peeling of resins from the thermoelectric conversion device 10 due to bending or the like can be prevented.

(6) In the thermoelectric conversion device 10 according to the present embodiment, the internal width of the fourth via holes 104 of the second insulator 12 is larger than the internal width of the first via holes 101 of the first insulator 11. Similarly, the internal width of the second via holes 102 of the first insulator 11 is larger than the internal width of the third via holes 103 of the second insulator 12.

Consequently, in the stacked body forming step (S80) of the method of manufacturing the thermoelectric conversion device 10, the parts of the first conductive paste 131 protruding from the first via holes 101 of the first insulator 11 can be easily inserted into the fourth via holes 104. Similarly, the parts of the second conductive paste 141 protruding from the third via holes 103 can be easily inserted into the second via holes 102.
As a result, this step can be performed in a short period of time.

(7) In the thermoelectric conversion device 10 according to the present embodiment, the volume of the parts of the first conductive paste 131 protruding from the first via holes 101 of the first insulator 11 is larger than the capacity of the fourth via holes 104 of the second insulator 12. Similarly, the volume of the parts of the second conductive paste 141 protruding from the third via holes 103 of the second insulator 12 is larger than the capacity of the second via holes 102 of the first insulator 11.

Accordingly, in the integrating step (S90) of the method of manufacturing the thermoelectric conversion device 10, the fourth via holes 104 are fully filled with the first conductive paste 131 subjected to the loads from the front and rear surface wiring patterns 111 and 121, and the first conductive paste 131 protrudes from the fourth via holes 104 toward the rear surface wiring patterns 121. Similarly, the second via holes 102 are fully filled with the second conductive paste 141 subjected to the loads from the front and rear surface wiring patterns 111 and 121, and the second conductive paste 141 protrudes from the second via holes 102 toward the front surface wiring patterns 111. Consequently, the first and second conductive pastes 131 and 141 are efficiently subjected to the loads from the front and rear surface wiring patterns 111 and 121 and solid-phase sintered, and become the first and second interlayer connection members 130 and 140, respectively.

(8) In the method of manufacturing the thermoelectric conversion device 10 according to the present embodiment, the first conductive paste filling step (S30) includes the first mask providing step (S31), the first conductive paste supplying step (S32), the first conductive paste collecting step (S33), the first mask peeling step (S34), and the like. In the first mask providing step (S31), the first insulator 11 is covered with the first mask 22 having the first mask holes 25. Furthermore, the surface of the first mask 22 that does not face the first insulator 11 is covered with the first metal mask 23 having the first metal mask holes 26. In the first conductive paste supplying step (S32), the first conductive paste 131 is supplied into the first metal mask holes 26, the first mask holes 25, and the first via holes 101 from above the first metal mask 23. In the first conductive paste collecting step (S33), the first metal mask 23 is removed from the upper surface of the first mask 22. Then, the first conductive paste 131 protruding from the first mask 22 is scraped off. In the first mask peeling step (S34), the first mask 22 is removed from the first insulator 11.

The second conductive paste filling step (S40) includes the second mask providing step (S41), the second conductive paste supplying step (S42), the second conductive paste collecting step (S43), the second mask peeling step (S44), and the like in the same manner as the first conductive paste filling step (S30).

Accordingly, the first mask 22 and the first metal mask 23 are used when the first conductive paste 131 is supplied into the first via holes 101 of the first insulator 11 with the method of manufacturing the thermoelectric conversion device 10. Consequently, the thickness of the first mask 22 can be reduced. Therefore, the amount of protrusion of the first conductive paste 131 from the first via holes 101 of the first insulator 11 can be reduced. Similarly, the second mask 29 and the second metal mask 30 are used when the second conductive paste 141 is supplied into the third via holes 103 of the second insulator 12 with the method of manufacturing the thermoelectric conversion device 10.

Consequently, the thickness of the second mask 29 can be reduced. Therefore, the amount of protrusion of the second conductive paste 141 from the third via holes 103 of the second insulator 12 can be reduced. Thus, the first and second insulators 11 and 12 with small thicknesses can be used in this manufacturing method. As a result, the thickness of the thermoelectric conversion device 10 can be reduced.

(9) With the method of manufacturing the thermoelectric conversion device 10 according to the present embodiment, the first and second insulators 11 and 12 each include a thermoplastic resin with a melting point higher than the temperature for solid-phase sintering of the first and second conductive pastes 131 and 141 or a thermosetting resin.

Consequently, the thermoelectric conversion device 10 with high heat resistance can be manufactured.

OTHER EMBODIMENTS

The technique of the present disclosure is not limited to the above embodiment. The technique of the present disclosure may be appropriately changed within the range described in the scope of claims. The technique of the present disclosure covers various modifications and equivalent variations. The above embodiments are not unrelated to one another but can be appropriately combined unless it is clearly impossible to combine them. Components that constitute each of the above embodiments are not necessarily essential unless it is specified that the components are essential and unless it is considered that the components are clearly essential in principle. In the above embodiments, the number, value, amount, range, etc. of components of the embodiments are not limited to a specific number or range unless otherwise specified and unless these are clearly limited to a specific number or range in principle. In the above embodiments, the material, shape, positional relation, etc. of components and the like are not limited to the described material, shape, positional relation, etc. unless otherwise specified and unless these are clearly limited to a specific material, shape, positional relation, etc. in principle.

For example, in the above embodiment, the thermoelectric conversion device includes the first insulator 11, the second insulator 12, the front surface protection member 110 having the front surface wiring patterns 111, and the rear surface protection member 120 having the rear surface wiring patterns 121. However, the present disclosure is not limited to this embodiment. In another embodiment, insulating sheets may be additionally provided between the first insulator 11 and the second insulator 12, between the first insulator 11 and the front surface protection member 110, and between the second insulator 12 and the rear surface protection member 120.

Alternatively, insulating sheets may be additionally provided on the surface of the front surface protection member 110 that does not face the first insulator 11 and on the surface of the rear surface protection member 120 that does not face the second insulator 12.

SUMMARY

According to the first aspect disclosed in some or all of the above embodiments, a method of manufacturing a thermoelectric conversion device as an aspect of the technique of the present disclosure includes first, second, and third forming steps, first and second filling steps, an arranging step, first and second preparing steps, and a pressure bonding step.

The first forming step includes forming first via holes and second via holes in a first insulator having a plate-like shape.

The second forming step includes forming third via holes and fourth via holes in a second insulator having a plate-like shape.

The first filling step includes filling the first via holes with a first conductive paste containing alloy powder and a solvent such that the first conductive paste protrudes from the first via holes by an amount larger than the thickness of the second insulator.

The second filling step includes filling the third via holes with a second conductive paste containing alloy powder and a solvent different from those of the first conductive paste such that the second conductive paste protrudes from the third via holes by an amount larger than the thickness of the first insulator.

The arranging step includes arranging the first insulator and the second insulator such that parts of the first conductive paste protruding from the first via holes of the first insulator face the fourth via holes of the second insulator and parts of the second conductive paste protruding from the third via holes of the second insulator face the second via holes of the first insulator.

The first preparing step includes preparing a front surface protection member having front surface wiring patterns connectable to the ends of the first conductive paste of the first insulator that do not face the second insulator and connectable to the ends of the second conductive paste protruding from the third via holes of the second insulator.

The second preparing step includes preparing a rear surface protection member having rear surface wiring patterns connectable to the other ends of the first conductive paste protruding from the first via holes of the first insulator and connectable to the other ends of the second conductive paste of the second insulator that do not face the first insulator.

The third forming step includes inserting the parts of the first conductive paste protruding from the first via holes into the fourth via holes, and inserting the parts of the second conductive paste protruding from the third via holes into the second via holes. The third forming step further includes arranging the front surface protection member having the front surface wiring patterns on the first insulator such that the front surface protection member does not face the second insulator, and arranging the rear surface protection member having the rear surface wiring patterns on the second insulator such that the rear surface protection member does not face the first insulator, thereby forming a stacked body.

The pressure bonding step includes forming first and second conductors by heating the stacked body while pressing the stacked body in the stacking direction and by solid-phase sintering of the first and the second conductive pastes. The pressure bonding step further includes electrically connecting the first conductor, the second conductor, the front surface wiring patterns, and the rear surface wiring patterns, and bonding the first insulator, the second insulator, the front surface protection member, and the rear surface protection member together under pressure.

According to the second aspect, the internal width of the fourth via holes formed in the second insulator is larger than the internal width of the first via holes. Similarly, the internal width of the second via holes formed in the first insulator is larger than the internal width of the third via holes.

Accordingly, when the first insulator and the second insulator are stacked, the parts of the first conductive paste protruding from the first via holes of the first insulator can be easily inserted into the fourth via holes. Similarly, the parts of the second conductive paste protruding from the third via holes can be easily inserted into the second via holes.

According to the third aspect, the step of filling the first via holes with the first conductive paste (first filling step) includes making the volume of the parts of the first conductive paste protruding from the first via holes of the first insulator larger than the capacity of the fourth via holes of the second insulator after the stacked body is heated while being pressed in the stacking direction. Similarly, the step of filling the third via holes with the second conductive paste (second filling step) includes making the volume of the parts of the second conductive paste protruding from the third via holes of the second insulator larger than the capacity of the second via holes of the first insulator after the stacked body is heated while being pressed in the stacking direction.

Accordingly, when the stacked body is heated while being pressed, the fourth via holes are fully filled with the first conductive paste subjected to the loads from the front and rear surface wiring patterns, and the first conductive paste protrudes from the fourth via holes toward the rear surface wiring patterns. Similarly, the second via holes are fully filled with the second conductive paste subjected to the loads from the front and rear surface wiring patterns, and the second conductive paste protrudes from the second via holes toward the front surface wiring patterns. Thus, the first and second conductive pastes are efficiently subjected to the loads from the front and rear surface wiring patterns and solid-phase sintered, and become the first and second conductors, respectively.

According to the fourth aspect, the step of filling the first via holes with the first conductive paste (first filling step) includes a first mask providing step, a first conductive paste supplying step, a first conductive paste collecting step, a first mask peeling step, and the like. The first mask providing step includes covering the first insulator with a first mask having a thickness larger than the thickness of the second insulator and having first mask holes at positions corresponding to the first via holes. The first mask providing step further includes covering the surface of the first mask that does not face the first insulator with a first metal mask having first metal mask holes corresponding to the first mask holes of the first mask. The first conductive paste supplying step includes putting the first conductive paste into the first metal mask holes, the first mask holes, and the first via holes from above the first metal mask. The first conductive paste collecting step includes removing the first metal mask from the upper surface of the first mask. The first conductive paste collecting step further includes scraping off the first conductive paste protruding from the first mask. The first mask peeling step includes removing the first mask from the first insulator. The step of filling the third via holes with the second conductive paste (second filling step) includes a second mask providing step, a second conductive paste supplying step, a second conductive paste collecting step, and a second mask peeling step. The second mask providing step includes covering the second insulator with a second mask having a thickness larger than the thickness of the first insulator and having second mask holes at positions corresponding to the third via holes. The second mask providing step further includes covering the surface of the second mask that does not face the second insulator with a second metal mask having second metal mask holes corresponding to the second mask holes of the second mask. The second conductive paste supplying step includes putting the second conductive paste into the second metal mask holes, the second mask holes, and the third via holes from above the second metal mask. The second conductive paste collecting step includes removing the second metal mask from the upper surface of the second mask. The second conductive paste collecting step further includes scraping off the second conductive paste protruding from the second mask. The second mask peeling step includes removing the second mask from the second insulator.

Accordingly, the first mask and the first metal mask are used when the first conductive paste is supplied into the first via holes of the first insulator with the method of manufacturing a thermoelectric conversion device. Consequently, the thickness of the first mask can be reduced. Therefore, the amount of protrusion of the first conductive paste from the first via holes of the first insulator can be reduced. Similarly, the second mask and the second metal mask are used when the second conductive paste is supplied into the third via holes of the second insulator with the method of manufacturing a thermoelectric conversion device. Consequently, the thickness of the second mask can be reduced. Therefore, the amount of protrusion of the second conductive paste from the third via holes of the second insulator can be reduced. Thus, the thickness of the first and second insulators can be reduced with this manufacturing method, and a thin thermoelectric conversion device can be manufactured.

According to the fifth aspect, the first and second insulators each include a resin (thermoplastic resin) with a melting point higher than the temperature for solid-phase sintering of the first and second conductive pastes.

Accordingly, a thermoelectric conversion device with high heat resistance can be manufactured.

According to the sixth aspect, the first and second insulators each include a thermosetting resin.

Accordingly, a thermoelectric conversion device with high heat resistance can be manufactured.

According to the seventh aspect, a thermoelectric conversion device as an aspect of the technique of the present disclosure includes a first insulator, a second insulator, a plurality of first conductors, a plurality of second conductors, front surface wiring patterns, rear surface wiring patterns, a front surface protection member, and a rear surface protection member.

The first insulator has a plate-like shape and has first and second via holes. The second insulator has a plate-like shape and has third via holes whose internal width is smaller than that of the second via holes and fourth via holes whose internal width is larger than that of the first via holes. The second insulator is stacked on the first insulator in its thickness direction. The plurality of first conductors are embedded in the first via holes of the first insulator and the fourth via holes of the second insulator and have a certain thermopower (first thermopower). The plurality of second conductors are embedded in the second via holes of the first insulator and the third via holes of the second insulator and have a thermopower (second thermopower) different from that of the first conductors.

The front surface wiring patterns are connected to, in the first insulator, the ends of the first conductors that do not face the second insulator and the ends of the second conductors. The rear surface wiring patterns are connected to, in the second insulator, the other ends of the first conductors that do not face the first insulator and the other ends of the second conductors. The front surface protection member covers the surface of the first insulator that does not face the second insulator and the front surface wiring patterns. The rear surface protection member covers the surface of the second insulator that does not face the first insulator and the rear surface wiring patterns.

A thermoelectric conversion device including this configuration can be manufactured using the above-mentioned manufacturing method. Thus, the thermoelectric conversion device with high heat resistance can be obtained.

What is claimed is:
1. A method of manufacturing a thermoelectric conversion device comprising:
a first forming step of preparing a first insulator having a plate-like shape and forming first via holes and second via holes in the first insulator;
a second forming step of preparing a second insulator having a plate-like shape and forming third via holes and fourth via holes in the second insulator;
a first filling step of filling the first via holes with a first conductive paste containing alloy powder and a solvent such that the first conductive paste protrudes from the first via holes by an amount larger than a thickness of the second insulator;
a second filling step of filling the third via holes with a second conductive paste containing alloy powder and a solvent different from those of the first conductive paste such that the second conductive paste protrudes from the third via holes by an amount larger than a thickness of the first insulator;
an arranging step of arranging the first insulator and the second insulator such that parts of the first conductive paste protruding from the first via holes of the first insulator face the fourth via holes of the second insulator and parts of the second conductive paste protruding from the third via holes of the second insulator face the second via holes of the first insulator;
a first preparing step of preparing a front surface protection member having front surface wiring patterns connectable to ends of the first conductive paste of the first insulator that do not face the second insulator and connectable to ends of the second conductive paste protruding from the third via holes of the second insulator;

a second preparing step of preparing a rear surface protection member having rear surface wiring patterns connectable to other ends of the first conductive paste protruding from the first via holes of the first insulator and connectable to other ends of the second conductive paste of the second insulator that do not face the first insulator;

a third forming step of forming a stacked body by inserting the parts of the first conductive paste protruding from the first via holes into the fourth via holes, inserting the parts of the second conductive paste protruding from the third via holes into the second via holes, arranging the front surface protection member having the front surface wiring patterns on the first insulator such that the front surface protection member does not face the second insulator, and arranging the rear surface protection member having the rear surface wiring patterns on the second insulator such that the rear surface protection member does not face the first insulator; and a pressure bonding step of forming a first conductor and a second conductor by heating the stacked body while pressing the stacked body in a stacking direction and by solid-phase sintering of the first conductive paste and the second conductive paste, electrically connecting the first conductor, the second conductor, the front surface wiring patterns, and the rear surface wiring patterns, and bonding the first insulator, the second insulator, the front surface protection member, and the rear surface protection member together under pressure.

2. The method of manufacturing a thermoelectric conversion device according to claim 1, wherein
an internal width of the fourth via holes formed in the second insulator is larger than an internal width of the first via holes, and
an internal width of the second via holes formed in the first insulator is larger than an internal width of the third via holes.

3. The method of manufacturing a thermoelectric conversion device according to claim 1, wherein
the first filling step includes making a volume of the parts of the first conductive paste protruding from the first via holes of the first insulator larger than a capacity of the fourth via holes after the stacked body is heated while being pressed in the stacking direction, and
the second filling step includes making a volume of the parts of the second conductive paste protruding from the third via holes of the second insulator larger than a capacity of the second via holes after the stacked body is heated while being pressed in the stacking direction.

4. The method of manufacturing a thermoelectric conversion device according to claim 1, wherein
the first filling step includes:
a first mask providing step of covering the first insulator with a first mask having a thickness larger than a thickness of the second insulator and having first mask holes at positions corresponding to the first via holes, and covering a surface of the first mask that does not face the first insulator with a first metal mask having first metal mask holes corresponding to the first mask holes of the first mask;
a first conductive paste supplying step of putting the first conductive paste into the first metal mask holes, the first mask holes, and the first via holes from above the first metal mask;
a first conductive paste collecting step of removing the first metal mask from the first mask and then scraping off the first conductive paste protruding from the first mask; and
a first mask peeling step of removing the first mask from the first insulator, and
the second filling step includes:
a second mask providing step of covering the second insulator with a second mask having a thickness larger than a thickness of the first insulator and having second mask holes at positions corresponding to the third via holes, and covering a surface of the second mask that does not face the second insulator with a second metal mask having second metal mask holes corresponding to the second mask holes of the second mask;
a second conductive paste supplying step of putting the second conductive paste into the second metal mask holes, the second mask holes, and the third via holes from above the second metal mask;
a second conductive paste collecting step of removing the second metal mask from the second mask and then scraping off the second conductive paste protruding from the second mask; and
a second mask peeling step of removing the second mask from the second insulator.

5. The method of manufacturing a thermoelectric conversion device according to claim 1, wherein
the first insulator and the second insulator each include a resin with a melting point higher than a temperature for solid-phase sintering of the first conductive paste and the second conductive paste.

6. The method of manufacturing a thermoelectric conversion device according to claim 1, wherein
the first insulator and the second insulator each include a thermosetting resin.

* * * * *